United States Patent [19]

Alamouti

[11] Patent Number: 5,907,565
[45] Date of Patent: May 25, 1999

[54] CYCLIC TRELLIS CODED MODULATION

[75] Inventor: Siavash M. Alamouti, Vancouver, Canada

[73] Assignee: AT&T Wireless Services, Inc., Kirkland, Wash.

[21] Appl. No.: 08/581,477

[22] Filed: Nov. 17, 1995

Related U.S. Application Data

[62] Division of application No. 08/344,111, Nov. 23, 1994.

[51] Int. Cl.[6] ............................. G06F 11/10; H03M 13/12
[52] U.S. Cl. .......................................... 371/43.4; 375/265
[58] Field of Search ................................... 371/37.1, 37.4, 371/37.5, 43, 44, 45, 49.1, 37.01, 43.1, 43.4, 43.6, 43.7, 43.8; 375/242, 244, 261, 265, 286, 262, 263, 264, 341

[56] References Cited

U.S. PATENT DOCUMENTS

| | | |
|---|---|---|
| 4,922,507 | 5/1990 | Simon et al. . |
| 4,939,555 | 7/1990 | Calderbank et al. . |
| 4,941,154 | 7/1990 | Wei . |
| 4,945,549 | 7/1990 | Simon et al. . |
| 5,023,900 | 6/1991 | Tayloe et al. . |
| 5,111,483 | 5/1992 | Serfaty . |
| 5,119,375 | 6/1992 | Paneth et al. . |
| 5,134,635 | 7/1992 | Hong et al. . |
| 5,263,033 | 11/1993 | Seshadri . |
| 5,311,553 | 5/1994 | Chennakeshu et al. . |
| 5,311,582 | 5/1994 | Davenport et al. . |
| 5,331,553 | 7/1994 | Muehllehner et al. ............. 250/363.02 |
| 5,408,498 | 4/1995 | Sasaki ...................... 375/286 |
| 5,418,798 | 5/1995 | Wei ........................... 371/43 |
| 5,428,631 | 6/1995 | Zehavi . |
| 5,475,716 | 12/1995 | Huang ....................... 375/354 |
| 5,535,228 | 7/1996 | Dong et al. ................ 371/43 |

FOREIGN PATENT DOCUMENTS

| | | |
|---|---|---|
| 943027895 | 9/1994 | European Pat. Off. . |
| US9203656 | 12/1992 | WIPO . |

OTHER PUBLICATIONS

Spenler, et al., "Differentially Coherent TC–PSK with Subset Dilation" IEICE Transactions, vol. E 74, No. 8, Aug. 1991, pp. 2220–2229.

Hanzo, et al., "On QAM Speech Transmission Schemes for Microcellular Mobile PCNs", Telecommunication Systems, vol. 4, No. 5, pp. 495–510, Sep.–Oct. 1993.

(List continued on next page.)

*Primary Examiner*—Emmanuel L. Moise
*Attorney, Agent, or Firm*—Knobbe, Martens, Olson & Bear LLP

[57] ABSTRACT

A universal method of trellis encoding signals mapped according to any signal constellation format involves constructing an encoder output table and a state transition table. The encoder output table defines the output symbol of an encoder given the input symbol and the present state of the encoder, while the state transition table defines the next state of the encoder given the present state of the encoder and the input applied to the encoder. The output table and the next state table are constructed with the objective of providing maximal distances between the branches of the trellis diagram without any regards for the shift register implementation of the code. Cyclic trellis-coded modulation is an example of such codes without feed-forward or feed-back shift register implementations, and with equal or better performance than "optimal" shift register trellis codes with 16 states or less. The cyclic trellis codes for both AWGN and Rayleigh fading applications can be constructed for any signal constellation without resorting to exhaustive searches.

9 Claims, 22 Drawing Sheets

OTHER PUBLICATIONS

Webb, et al., "Does 16–QAM Provide an Alternative to a Half–Rate GSM Speech Codec?", IEEE, pp. 511–516, 1991.

Dimakis, C.E., prof. Kouris, S.S., Avramis, S.K., "Performance Evaluation of Concatenated Coding Schemes on Multilevel QAM Signalling in Non–Gaussian Products Environment" IEEE Proceedings–1, vol. 140, No. 4, Aug. 1993, pp. 269–276.

Zein, N.F., Clarkson, T.G., "Optiumum Erasure Threshold in Reed–Solomon Coded Differential 16–Star–QAM Modulation" Electronics Letters, vol. 29, No. 20, Sep. 30, 1993, pp. 1746–1747.

Liu, Yow–Jong, Biglieri, Ezio, "Error Probability for Digital Transmission Over Nonlinear Channels with Application to TCM", for IEEE Transactions on Information Theory, vol. 36, No. 5, Sep. 1990, pp. 1101–1110.

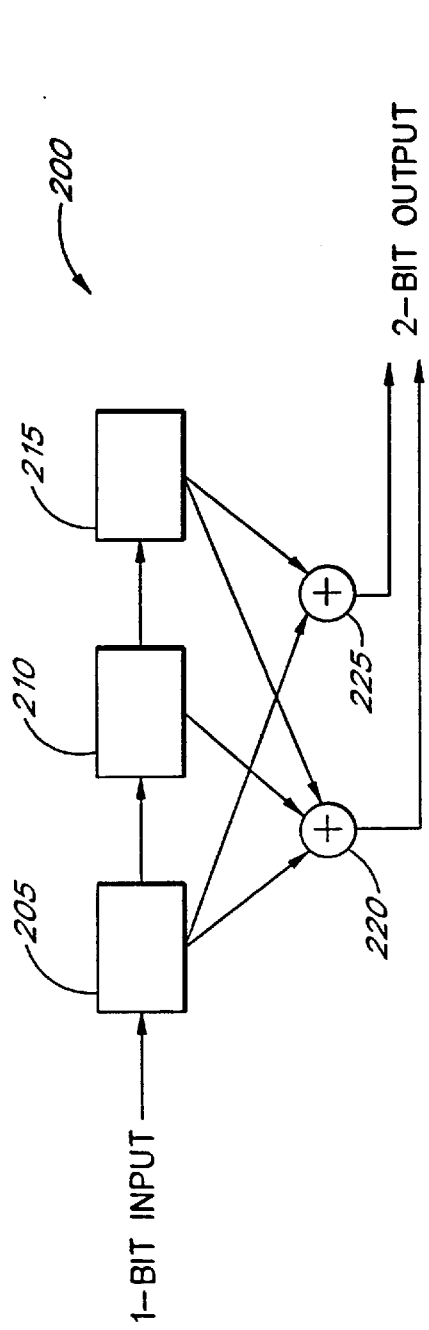

SUBSET A  SUBSET B

OUTPUT TABLE SET
PARTITIONING FOR AWGN

INPUT

|  | 0 | 1 | 2 | 3 |
|---|---|---|---|---|
| 0 | 0 | 2 | 4 | 6 |
| 1 | 1 | 3 | 5 | 7 |
| 2 | 0 | 2 | 4 | 6 |
| 3 | 1 | 3 | 5 | 7 |
| 4 | 0 | 2 | 4 | 6 |
| 5 | 1 | 3 | 5 | 7 |
| 6 | 0 | 2 | 4 | 6 |
| 7 | 1 | 3 | 5 | 7 |
| 8 | 0 | 2 | 4 | 6 |
| 9 | 1 | 3 | 5 | 7 |
| 10 | 0 | 2 | 4 | 6 |
| 11 | 1 | 3 | 5 | 7 |
| 12 | 0 | 2 | 4 | 6 |
| 13 | 1 | 3 | 5 | 7 |
| 14 | 0 | 2 | 4 | 6 |
| 15 | 1 | 3 | 5 | 7 |

PRESENT STATE (row labels)

AWGN ENCODER OUTPUT TABLE

FIG. 10

SUBSET A                SUBSET B

OUTPUT TABLE SET
PARTITIONING FOR RAYLEIGH FADING

INPUT

|  | 0 | 1 | 2 | 3 |
|---|---|---|---|---|
| 0 | 0 | 3 | 5 | 6 |
| 1 | 1 | 2 | 4 | 7 |
| 2 | 0 | 3 | 5 | 6 |
| 3 | 1 | 2 | 4 | 7 |
| 4 | 0 | 3 | 5 | 6 |
| 5 | 1 | 2 | 4 | 7 |
| 6 | 0 | 3 | 5 | 6 |
| 7 | 1 | 2 | 4 | 7 |
| 8 | 0 | 3 | 5 | 6 |
| 9 | 1 | 2 | 4 | 7 |
| 10 | 0 | 3 | 5 | 6 |
| 11 | 1 | 2 | 4 | 7 |
| 12 | 0 | 3 | 5 | 6 |
| 13 | 1 | 2 | 4 | 7 |
| 14 | 0 | 3 | 5 | 6 |
| 15 | 1 | 2 | 4 | 7 |

PRESENT STATE (row labels)

OUTPUT TABLE FOR
RAYLEIGH FADING APPLICATIONS

FIG. 12

INPUT

| | 0 | 1 | 2 | 3 |
|---|---|---|---|---|
| 0 | 0 | 1 | 2 | 3 |
| 1 | 4 | 5 | 6 | 7 |
| 2 | 8 | 9 | 10 | 11 |
| 3 | 12 | 13 | 14 | 15 |
| 4 | 3 | 0 | 1 | 2 |
| 5 | 7 | 4 | 5 | 6 |
| 6 | 11 | 8 | 9 | 10 |
| 7 | 15 | 12 | 13 | 14 |
| 8 | 2 | 3 | 0 | 1 |
| 9 | 6 | 7 | 4 | 5 |
| 10 | 10 | 11 | 8 | 9 |
| 11 | 14 | 15 | 12 | 13 |
| 12 | 1 | 2 | 3 | 0 |
| 13 | 5 | 6 | 7 | 4 |
| 14 | 9 | 10 | 11 | 8 |
| 15 | 13 | 14 | 15 | 12 |

PRESENT STATE (rows)

NEXT STATE TABLE

FIG. 13

OUTPUT TABLE SET
PARTITIONING FOR AWGN

INPUT

| | 0 | 1 | 2 | 3 | 4 | 5 | 6 | 7 |
|---|---|---|---|---|---|---|---|---|
| 0 | 0 | 2 | 4 | 6 | 8 | 10 | 12 | 14 |
| 1 | 1 | 3 | 5 | 7 | 9 | 11 | 13 | 15 |
| 2 | 0 | 2 | 4 | 6 | 8 | 10 | 12 | 14 |
| 3 | 1 | 3 | 5 | 7 | 9 | 11 | 13 | 15 |
| 4 | 0 | 2 | 4 | 6 | 8 | 10 | 12 | 14 |
| 5 | 1 | 3 | 5 | 7 | 9 | 11 | 13 | 15 |
| 6 | 0 | 2 | 4 | 6 | 8 | 10 | 12 | 14 |
| 7 | 1 | 3 | 5 | 7 | 9 | 11 | 13 | 15 |
| 8 | 0 | 2 | 4 | 6 | 8 | 10 | 12 | 14 |
| 9 | 1 | 3 | 5 | 7 | 9 | 11 | 13 | 15 |
| 10 | 0 | 2 | 4 | 6 | 8 | 10 | 12 | 14 |
| 11 | 1 | 3 | 5 | 7 | 9 | 11 | 13 | 15 |
| 12 | 0 | 2 | 4 | 6 | 8 | 10 | 12 | 14 |
| 13 | 1 | 3 | 5 | 7 | 9 | 11 | 13 | 15 |
| 14 | 0 | 2 | 4 | 6 | 8 | 10 | 12 | 14 |
| 15 | 1 | 3 | 5 | 7 | 9 | 11 | 13 | 15 |

PRESENT STATE (row labels)

OUTPUT TABLE FOR AWGN

*FIG. 15*

OUTPUT TABLE SET
PARTITIONING FOR RAYLEIGH FADING

INPUT

| Present State | 0 | 1 | 2 | 3 | 4 | 5 | 6 | 7 |
|---|---|---|---|---|---|---|---|---|
| 0 | 0 | 3 | 5 | 6 | 9 | 10 | 12 | 15 |
| 1 | 1 | 2 | 4 | 7 | 8 | 11 | 13 | 14 |
| 2 | 0 | 3 | 5 | 6 | 9 | 10 | 12 | 15 |
| 3 | 1 | 2 | 4 | 7 | 8 | 11 | 13 | 14 |
| 4 | 0 | 3 | 5 | 6 | 9 | 10 | 12 | 15 |
| 5 | 1 | 2 | 4 | 7 | 8 | 11 | 13 | 14 |
| 6 | 0 | 3 | 5 | 6 | 9 | 10 | 12 | 15 |
| 7 | 1 | 2 | 4 | 7 | 8 | 11 | 13 | 14 |
| 8 | 0 | 3 | 5 | 6 | 9 | 10 | 12 | 15 |
| 9 | 1 | 2 | 4 | 7 | 8 | 11 | 13 | 14 |
| 10 | 0 | 3 | 5 | 6 | 9 | 10 | 12 | 15 |
| 11 | 1 | 2 | 4 | 7 | 8 | 11 | 13 | 14 |
| 12 | 0 | 3 | 5 | 6 | 9 | 10 | 12 | 15 |
| 13 | 1 | 2 | 4 | 7 | 8 | 11 | 13 | 14 |
| 14 | 0 | 3 | 5 | 6 | 9 | 10 | 12 | 15 |
| 15 | 1 | 2 | 4 | 7 | 8 | 11 | 13 | 14 |

RAYLEIGH FADING OUTPUT TABLE

FIG. 17

INPUT

| Present State | 0 | 1 | 2 | 3 | 4 | 5 | 6 | 7 |
|---|---|---|---|---|---|---|---|---|
| 0 | 0 | 1 | 2 | 3 | 4 | 5 | 6 | 7 |
| 1 | 8 | 9 | 10 | 11 | 12 | 13 | 14 | 15 |
| 2 | 7 | 0 | 1 | 2 | 3 | 4 | 5 | 6 |
| 3 | 15 | 8 | 9 | 10 | 11 | 12 | 13 | 14 |
| 4 | 6 | 7 | 0 | 1 | 2 | 3 | 4 | 5 |
| 5 | 14 | 15 | 8 | 9 | 10 | 11 | 12 | 13 |
| 6 | 5 | 6 | 7 | 0 | 1 | 2 | 3 | 4 |
| 7 | 13 | 14 | 15 | 8 | 9 | 10 | 11 | 12 |
| 8 | 4 | 5 | 6 | 7 | 0 | 1 | 2 | 3 |
| 9 | 12 | 13 | 14 | 15 | 8 | 9 | 10 | 11 |
| 10 | 3 | 4 | 5 | 6 | 7 | 0 | 1 | 2 |
| 11 | 11 | 12 | 13 | 14 | 15 | 8 | 9 | 10 |
| 12 | 2 | 3 | 4 | 5 | 6 | 7 | 0 | 1 |
| 13 | 10 | 11 | 12 | 13 | 14 | 15 | 8 | 9 |
| 14 | 1 | 2 | 3 | 4 | 5 | 6 | 7 | 0 |
| 15 | 9 | 10 | 11 | 12 | 13 | 14 | 15 | 8 |

NEXT STATE TABLE

FIG. 18

| PRESENT STATE | INPUT | | | | | | | |
|---|---|---|---|---|---|---|---|---|
| | 0 | 1 | 2 | . | . | $2^n-3$ | $2^n-2$ | $2^n-1$ |
| EVEN STATES | 0 | 2 | 4 | . | . | $2^{n+1}-6$ | $2^{n+1}-4$ | $2^{n+1}-2$ |
| ODD STATES | 1 | 3 | 5 | . | . | $2^{n+1}-5$ | $2^{n+1}-3$ | $2^{n+1}-1$ |

FIG. 19

| PRESENT STATE | INPUT | | | | | | | |
|---|---|---|---|---|---|---|---|---|
| | 0 | 1 | 2 | . | . | $2^n-3$ | $2^n-2$ | $2^n-1$ |
| 0 | 0 | 1 | 2 | . | . | $2^n-3$ | $2^n-2$ | $2^n-1$ |
| 1 | $2^n-1$ | 0 | 1 | . | . | $2^n-4$ | $2^n-3$ | $2^n-2$ |
| 2I | $2^n-2$ | $2^n-3$ | 0 | . | . | $2^n-5$ | $2^n-4$ | $2^n-3$ |
| | . | . | . | . | . | . | . | . |
| | . | . | . | . | . | . | . | . |
| $(2^n-2)$I | 2 | 3 | 4 | . | . | $2^n-1$ | 0 | 1 |
| $(2^n-1)$I | 1 | 2 | 3 | . | . | $2^n-2$ | $2^n-1$ | 0 |

FIG. 20A

INPUT

| PRESENT STATE | 0 | 1 | 2 | . | . | $2^n-3$ | $2^n-2$ | $2^n-1$ |
|---|---|---|---|---|---|---|---|---|
| 1 | $2^n$ | $2^n+1$ | $2^n+2$ | . | . | $2^{n+1}-3$ | $2^{n+1}-2$ | $2^{n+1}-1$ |
| $l+1$ | $2^{n+1}-1$ | $2^n$ | $2^n+1$ | . | . | $2^{n+1}-4$ | $2^{n+1}-3$ | $2^{n+1}-2$ |
| $2l+1$ | $2^{n+1}-2$ | $2^{n+1}-1$ | $2^n$ | . | . | $2^{n+1}-5$ | $2^{n+1}-4$ | $2^{n+1}-3$ |
| . | . | . | . | . | . | . | . | . |
| . | . | . | . | . | . | . | . | . |
| $(2^n-2)l+1$ | $2^n+2$ | $2^n+3$ | $2^n+4$ | . | . | $2^{n+1}-1$ | $2^n$ | $2^n+1$ |
| $(2^n-1)l+1$ | $2^n+1$ | $2^n+2$ | $2^n+3$ | . | . | $2^{n+1}-2$ | $2^{n+1}-1$ | $2^n$ |

FIG. 20B

INPUT

| PRESENT STATE | 0 | 1 | 2 | . | . | $2^n-3$ | $2^n-2$ | $2^n-1$ |
|---|---|---|---|---|---|---|---|---|
| $i$ | $2^{n+i-1}$ | $2^{n+i-1}+1$ | $2^{n+i-1}+2$ | . | . | $2^{n+i}-3$ | $2^{n+i}-2$ | $2^{n+i}-1$ |
| $l+i$ | $2^{n+i}-1$ | $2^{n+i-1}$ | $2^{n+i-1}+1$ | . | . | $2^{n+i}-4$ | $2^{n+i}-3$ | $2^{n+i}-2$ |
| $2l+i$ | $2^{n+i}-2$ | $2^{n+i}-1$ | $2^{n+i-1}$ | . | . | $2^{n+i}-5$ | $2^{n+i}-4$ | $2^{n+i}-3$ |
| . | . | . | . | . | . | . | . | . |
| . | . | . | . | . | . | . | . | . |
| $(2^n-2)l+i$ | $2^{n+i-1}+2$ | $2^{n+i-1}+3$ | $2^{n+i-1}+4$ | . | . | $2^{n+i}-1$ | $2^{n+i-1}$ | $2^{n+i-1}+1$ |
| $(2^n-1)l+i$ | $2^{n+i-1}+1$ | $2^{n+i-1}+2$ | $2^{n+i-1}+3$ | . | . | $2^{n+i}-2$ | $2^{n+i}-1$ | $2^{n+i-1}$ |

FIG. 20C

INPUT

| PRESENT STATE | 0 | 1 | 2 | 3 |
|---|---|---|---|---|
| 0 | 0 | 1 | 2 | 3 |
| 1 | 4 | 5 | 6 | 7 |
| 2 | 8 | 9 | 10 | 11 |
| 3 | 12 | 13 | 14 | 15 |
| 4 | 3 | 0 | 1 | 2 |
| 5 | 7 | 4 | 5 | 6 |
| 6 | 11 | 8 | 9 | 10 |
| 7 | 15 | 12 | 13 | 14 |
| 8 | 2 | 3 | 0 | 1 |
| 9 | 6 | 7 | 4 | 5 |
| 10 | 9 | 10 | 11 | 8 |
| 11 | 14 | 15 | 12 | 13 |
| 12 | 1 | 2 | 3 | 0 |
| 13 | 5 | 6 | 7 | 4 |
| 14 | 10 | 11 | 8 | 9 |
| 15 | 13 | 14 | 15 | 12 |

(NEXT STATE TABLE TO AVOID CATASTROPHIC CODES)

*FIG. 22*

CYCLIC TRELLIS CODED MODULATION

This application is a divisional of U.S. patent application Ser. No. 08/344,111, filed Nov. 23, 1994.

FIELD OF THE INVENTION

The present invention relates to digital communication systems, and, in particular, to forward error correction through trellis coded modulation.

BRIEF DESCRIPTION OF THE RELATED ART

In recent years, much of the research and development in the communications industry has been concentrated in the area of digital signal transmission. As is well known in the art, digital signal transmission typically involves transmission of data with a carrier frequency. The carrier frequency is modulated by data so that a frequency bandwidth is occupied by the transmitted signal. The growing demand for access to data and communication services has placed a significant strain on the available bandwidth. Moreover, there is an ever increasing demand for increased data communication rates for the purpose of decreasing the data transmission time. An increase of the rate of the data typically results in an increased bandwidth requirement, placing a further strain upon the available bandwidth for transmission of signals.

In an effort to increase the data rates without sacrificing the available bandwidth, a number of increasingly sophisticated coded modulation schemes have been developed. For example, quadrature amplitude modulation (QAM) employs both amplitude and phase modulation in order to encode more data within a given frequency bandwidth. Another modulation technique involves multiple phase shift keying (MPSK) to increase data capacity within a given bandwidth. These high level modulation schemes are very sensitive to channel impairments. That is, the information encoded by means of such techniques is often lost during transmission due to noise, Rayleigh fading and other factors which are introduced over the communication medium.

In order to compensate for the increased sensitivity of these high level modulation schemes, various forward error correction coding techniques are employed. One such error coding technique is trellis coded modulation. Trellis coded modulation is desirable since it combines modulation and error coding operations to provide effective error control coding without sacrificing power and bandwidth efficiency. Furthermore, it has been shown that trellis coded modulation schemes perform significantly better than their uncoded equivalents with the same power and bandwidth efficiency. Trellis codes have been developed for many of the high-level, high-rate modulation schemes, including well-known 8-PSK modulation and Square 16 QAM modulation. However, designers of past systems have not considered providing a technique of trellis coding which applies to any phase and/or amplitude modulation scheme, as well as codes having various constraint lengths, while providing optimal or near optimal error performance.

Typically, a new set of "optimal" trellis codes must be found individually for each modulation scheme. The "optimal" trellis codes are typically found through algorithms that search all the possible trellis code structures that have simple feedback of feed-forward shift register implementations. Even a small change in system parameters, such as code constraint length, requires a search for an entirely new set of trellis codes.

SUMMARY OF THE INVENTION

The present invention provides a system and method for trellis-coded modulation and demodulation of phase and/or amplitude modulated signals complying with varying signal constellations and constraint lengths, while yielding optimum or near optimum error performance. The cyclic trellis encoding method of the present invention can generate a family of trellis codes whose performance is better than or equal to so called "optimal" codes generated by other techniques. Generally, the cyclic trellis codes do not have a feed-forward or feed-back shift register implementation.

A method of cyclic trellis encoding a data sequence within an encoder is disclosed. The data sequence is to be mapped according to a predetermined modulation scheme having an associated signal constellation. The signal constellation has defined coordinate points corresponding to phase and amplitude characteristics corresponding to output symbols from the encoder. The method comprises the step of defining an output table of output symbols. The output table has present state rows and input symbol columns. The output symbols are determined as a function of symbols input to the encoder and a present state of the encoder. The method of the present invention further comprises the step of defining the output table, which further comprises the substeps of assigning each of the output symbols to the points of the signal constellation; partitioning the points of the signal constellation into a first subset of output symbols and a second subset of output symbols; loading even ones of the present state rows with output symbols from the first subset; and loading odd ones of the present state rows with output symbols from the second subset. The method further comprises the step of defining a next-state table of next states for the encoder. The next-state table has present state rows and input symbol columns, wherein the next states are defined as a function of symbols input to the encoder and a present state of the encoder. The method further comprises the step of defining the next-state look-up table, which further comprises the substeps of loading first ones of the present state rows with next states of the encoder until at least one of the first present state rows is full and all of the next state values have been used; and loading other ones of the present state rows with next states that are cyclicly shifted from the next states in each of the first ones of the present state rows until all of the present state rows are filled. The method of the present invention further comprises the step of implementing the output and next-state tables within the encoder so that output symbols from the encoder are determined by input symbols to the encoder and the present state of the encoder in accordance with the output table, and transitions from the present state of the encoder to the next state of the encoder are performed in accordance with the next-state table. Finally, the method comprises the step of mapping the output symbols into signals having phase and amplitude characteristics corresponding to points on the signal constellation.

In a preferred embodiment of the present invention, the coordinate points of the signal constellation are assigned output symbols according to natural mapping techniques when the predominant channel interference is Additive White Gaussian Noise.

In another preferred embodiment the coordinate points of the signal constellation are assigned to output symbols according to Gray coding techniques when the predominant channel interference is Rayleigh fading.

In another embodiment of the present invention, a method of cyclic trellis encoding an input data sequence with an encoder is disclosed. The input data sequence is to be mapped according to a predetermined modulation scheme having an associated signal constellation. The signal constellation has defined coordinate points corresponding to phase and amplitude characteristics of output symbols from the encoder. The encoder receives n inputs, corresponding to $2^n$ input values, and outputs n+1 outputs corresponding to $2^{n+1}$ output values. The encoder has $2^k$ possible states. The method of the present invention comprises the steps of defining an output table having $2^k$ present state rows and $2^n$ input symbol columns, wherein the output symbols from the encoder are determined as a function of input symbols to the encoder and a present state of the encoder; defining the output table which further comprises the substeps of assigning values to the points of the signal constellation, where the values correspond to the output symbols; partitioning the signal constellation into a first subset of $2^n$ output symbols and a second subset of $2^n$ output symbols, where the first subset and second subset are symmetric; loading even ones of the present state rows with values corresponding to output symbols from the first subset; and loading odd ones of the present state rows with values corresponding to output symbols from the second subset. The method of the present invention further comprises the step of defining a next-state table of a plurality of next states, where the next-state table has $2^k$ present state rows and $2^n$ input symbol columns. The next state of the encoder is determined as a function of the input symbols to the encoder and the present state of the encoder. The step of defining the next-state table further comprises the substeps of dividing the next states into $2^{k-n}$ subsets wherein each subset has $2^n$ next states; and loading a first one of the present state rows with next states from a first one of the subsets, a second one of the present state rows with the next states from a second one of the subsets, and continuing this loading until the $2^{k-n}$th present state row is loaded with the next states from the $2^{k-n}$th one of the subsets. The method of the present invention further comprises the steps of implementing the output and next-state tables within the encoder so that output symbols from the encoder are determined as a function of input symbols to the encoder and the present state of the encoder in accordance with the output table, and transitions from the present state of the encoder to the next state of the encoder are in accordance with the next-state table; and mapping the output symbols from the encoder into signals having phase and amplitude characteristics corresponding to respective output symbol points on the signal constellation.

In a preferred embodiment of the invention, the coordinate points of the signal constellation are assigned output symbols according to natural mapping techniques when the predominant channel interference is Additive White Gaussian Noise.

In another preferred embodiment of the invention, the coordinate points of the signal constellation are assigned output symbols according to Gray coding techniques when the predominant channel interference is Rayleigh fading.

Under another aspect, the present invention provides for a trellis encoder which trellis encodes input data signals, wherein the input data signals are mapped according to a modulation scheme such that a signal constellation defined by the modulation scheme cannot be set partitioned such that each level of set partitioning results in a substantially increased minimum Euclidean distance between points of the signal constellation.

Another embodiment of the present invention calls for a transmitter for a trellis-coded, multi-level modulation communication system. The transmitter comprises a cyclic trellis encoder which receives a sequence of data input symbols and outputs a sequence of encoded output symbols. The cyclic trellis encoder has a set of present states partitioned into subsets. The encoder comprises a state transition table containing a plurality of next state values for the encoder. The next state values are defined based upon the present state of the encoder and the input symbol. The next state values are assigned to each of the present state subsets such that the next state values for any present state subset are shifted cyclicly for successive members of the any present state subset. A present state memory element connects to the state transition look-up table and temporarily stores a next state value output by the state transition look-up table. An encoder output look-up table connects to the present state memory element which selects an output symbol based upon the present state of the encoder and the presently received one of the input symbols. The present states and the output values are partitioned into two subsets so that the output look-up table outputs a symbol which belongs to a first output subset when in one of the present state subsets and outputs a symbol which belongs to a second output subset when in the other of the present state subsets. A signal mapper connects to the output look-up table, and maps outputs of the encoder output look-up table into encoded output signals from two symmetric signal constellations. Finally, a transmitter circuit transmits the encoded output signals over a communications medium.

In a preferred embodiment, the signal mapper maps according to Gray coding techniques. In another preferred embodiment, the signal mapper maps according to natural mapping techniques.

Under another aspect, the apparatus of the present invention comprises a receiver for a trellis-coded multi-level modulation communication system. The receiver comprises a trellis decoder which receives a baseband signal. The trellis decoder comprises a means for reconstructing a trellis structure defined by a state transition look-up table wherein a set of present states is partitioned into subsets having successive members, and next state values assigned to each of the present state subsets are shifted cyclicly for successive members of the present state subset. The trellis decoder further comprises a means for determining input and output symbols associated with branches of the trellis structure as defined by an encoder output look-up table. The present states and the output values are partitioned into two subsets so that the output look-up table outputs a symbol which belongs to a first output subset when in one of the present state subsets, and outputs a symbol which belongs to a second output subset when in the other of the present state subsets. The decoder also includes a calculation circuit which determines the Euclidean distances between points on a phase/amplitude coordinate system corresponding to the received signals and points of a phase/amplitude signal constellation corresponding to signals associated with branches on the trellis structure. Finally, the trellis decoder comprises a comparator circuit which selects the most likely path of the received signal on the trellis structure on the basis of the determined Euclidean distances.

In a further embodiment of the present invention, a method is disclosed of forward error correction coding for a data signal mapped according to a given signal constellation. The method comprises the steps of defining a family of convolutional codes. The family of convolutional codes is characterized in that the family of codes are not capable of being generated by means of a feed-forward or feed-back shift register implementation. The step of defining further comprises the substeps of establishing a next-state value corresponding to each present-state/input-value pair; establishing an output value corresponding to each present-state/input-value pair; receiving an input data symbol corresponding to an input value; providing an output value in response to the reception of the input value, wherein the output value is determined by the input value and the present-state value, and the present state value is determined by the previous next state value; generating an output data symbol, wherein the output symbol is determined by the output value; and encoding a data signal to correspond to the output symbol as determined by a signal mapping scheme.

In accordance with a still further aspect of the present invention, a method of encoding signals mapped according to any signal constellation format comprises the steps of dividing the signal constellation points into two symmetrical sets of symbol points, and cyclic trellis encoding data to be mapped according to the signal constellation.

Under a further aspect, the present invention comprises a data encoder. the data encoder comprises a cyclic trellis encoder and a transmitter coupled to the cyclic trellis encoder.

Under a yet further aspect, the present invention comprises a trellis encoder that may be implemented as a state machine or a look-up table memory or in software, but which cannot be implemented as a shift register. In one embodiment, the cyclic trellis encoder is such as not to allow a feed-forward shift register implementation. According to a further aspect, the cyclic trellis encoder is such as not to allow a feed-back shift register implementation.

In yet a further embodiment, the present invention is a data encoder for use in data communication application, wherein a plurality of input data values are trellis encoded to form output data. The data encoder comprises an input and an encoder circuit coupled to the input. The encoder circuit has a plurality of present states, and is responsive to the plurality of input data values on the input to transition to a next state. The next states correspond to each input which is cyclicly shifted for different ones of the present states. The encoder further comprises an output coupled to the encoder circuit. The output is responsive to the encoder circuit to generate output data.

A trellis encoder constructed in accordance with the teachings of the present invention can be adapted to trellis encode data to be mapped for signal constellations. The signal constellations can be set partitioned such that each level of set partitioning results in substantially increased minimum Euclidean distance between points of the signal constellation. The trellis encoder can also be adapted to trellis encode data to be mapped for signal constellations which cannot be set partitioned such that each level of set partitioning results in substantially increased minimum Euclidean distance between points of the signal constellation.

BRIEF DESCRIPTION OF THE DRAWINGS

FIG. 2A is an exemplary convolutional encoder circuit.

FIG. 2B is a state table describing the operation of the convolutional encoder of FIG. 2A.

FIG. 10 depicts a 16 state, rate ⅔ encoder output look-up table for any 8 level modulation scheme in AWGN environment which defines the encoder output value given the present state of the encoder and the input applied to the encoder.

FIG. 12 depicts a 16 state, rate ⅔ encoder output look-up table for any 8 level modulation scheme in Rayleigh fading environment which defines the encoder output value given the present state of the encoder and the input applied to the encoder.

FIG. 13 depicts a 16 state transition table for any 8 level modulation scheme which defines the next state of the encoder given the present state of the encoder and the input to the encoder.

FIG. 15 depicts a 16 state, rate ¾ encoder output look-up table for any 16 level modulation scheme in AWGN environment which defines the encoder output value given the present state of the encoder and the input applied to the encoder.

FIG. 17 depicts an encoder output look-up table for any 16 level modulation scheme in Rayleigh fading environment which defines the encoder output value given the present state of the encoder and the input applied to the encoder.

FIG. 18 depicts a state transition table for any 16 level modulation scheme which defines the next state of the encoder given the present state of the encoder and the input to the encoder.

FIG. 19 depicts an encoder output look-up table in generalized form which defines the encoder output value given the present state of the encoder and the input applied to the encoder for any signal constellation and any code constraint length, for applications in AWGN environment.

FIGS. 20A–20C depict a state transition table in generalized form which defines the next state of the encoder given the present state of the encoder and the input to the encoder for any signal constellation and any code constraint length.

FIG. 22 depicts a state transition table for any 8 level modulation scheme which may be used to avoid catastrophic codes.

DETAILED DESCRIPTION OF THE INVENTION

Figure 1A:
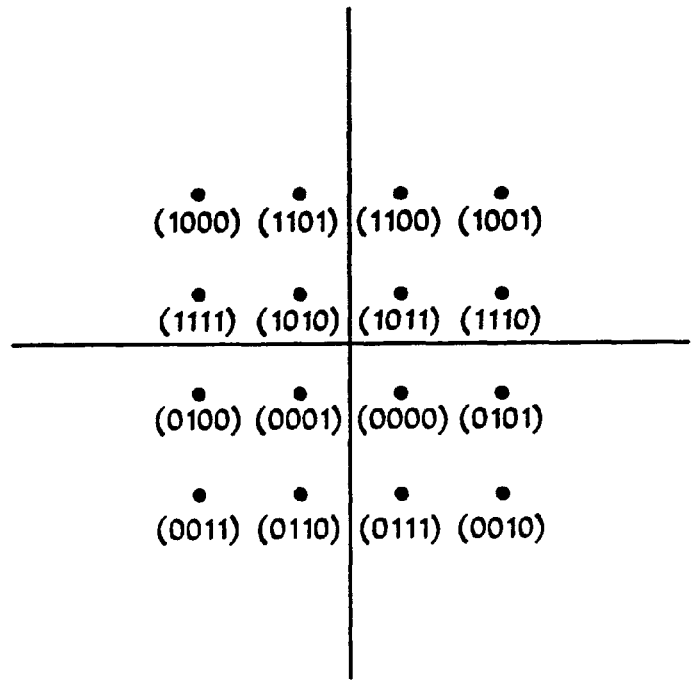
FIGS. 1A and 1B are graphical representations of signal constellations corresponding to Square 16 QAM and 16 Star QAM signals, respectively.
Figure 1B:
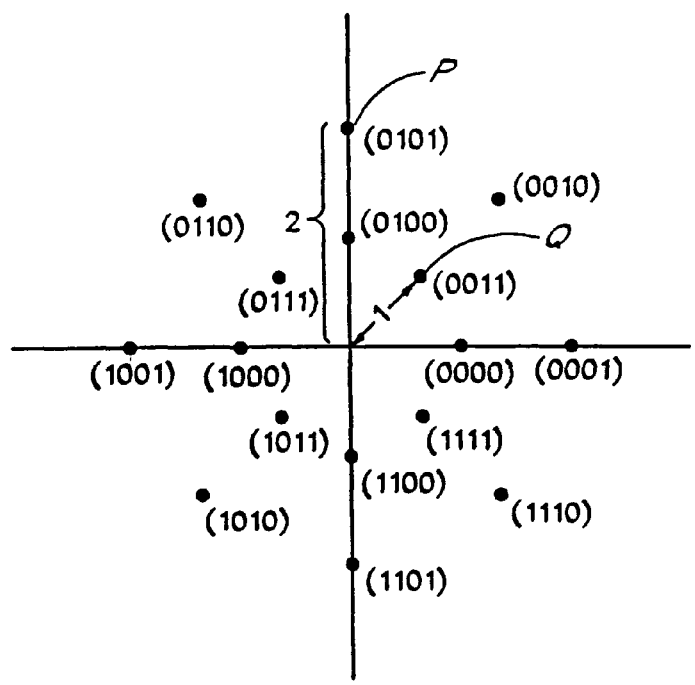

FIGS. 1A and 1B graphically depict signal constellations for a Square 16 QAM scheme and a 16 Star QAM scheme, respectively. The signal constellations depicted in FIGS. 1A and 1B are merely for exemplary purposes to illustrate different signal constellation formats such as may be commonly used in the art. The signal constellations depicted in FIGS. 1A and 1B are represented in polar coordinate form wherein each point of the signal constellations represents the determinate phase and the amplitude of an information symbol. For example, a point labeled "Q" in FIG. 1B corresponds to a signal having an amplitude defined as 1 and a phase of 45°, while a point labeled "P" in FIG. 1B corresponds to a signal having an amplitude defined as 2 which has a phase of 90°. For this particular 16 Star QAM constellation, the inner ring of signal points are amplitude value 1 points and the outer ring of signal points are amplitude value 2 points.

Signal constellations are a convenient way to graphically depict the binary data encoded by means of various phase and amplitude modulation schemes. For example, as shown in FIGS. 1A and 1B, there is a 4-bit binary word ("symbol") associated with each point on the 16-point signal constellations. This means that a detector is configured to assign a specified data word for a detected signal having a given amplitude and phase. Thus, for example, in the 16 Star QAM constellation of FIG. 1B, when a detector (or decoder) detects a signal which has an amplitude closest to 1, and which has a phase closest to 45°, the detector will assign the data word 0011 (decimal 3) to that signal. Similarly, when a detector detects a signal which has an amplitude closest to 2, and which has a phase closest to 90°, the detector will assign the data word 0101 (decimal 5) to that signal. The data assignments in FIGS. 1A and 1B are merely exemplary. Other assignments are possible, as will be apparent from the discussion below.

To minimize the effects of additive white Gaussian noise (AWGN) as well as the effects of Rayleigh fading and other channel impairments, one or more error encoding techniques are used in order to provide for accurate transmission and detection of data, especially when very high level modulation schemes are employed.

TRELLIS-CODED MODULATION

Trellis-coded modulation is a forward error correction coding technique which is also well known in the art. Trellis codes are convolutional codes that are designed and optimized according to a specific modulation scheme. A convolutional encoder encodes information symbols based upon the present input symbol and the state of the encoder. The present state of the encoder is determined by the symbols which previously entered the encoder. That is, the encoded symbol is a function of the present input symbol and also symbols that entered the encoder before the present input symbol. Thus, a convolutional encoder has memory.

Convolutional codes are typically implemented by shift registers and summers. The next state and the output of the encoder are functions of the present state of the register or look-up table (i.e., the value of the bits presently stored within the register or look-up table memory), and the input to the register or look-up table.

FIG. 2A and the accompanying table 230 shown in FIG. 2B illustrate an exemplary embodiment of a convolutional encoder 200 implemented by means of shift registers, and the corresponding state table. The encoder 200 is simply shown here in order to illustrate the operation and implementation of a convolutional encoder, and is not to be construed as an implementation of the trellis encoder used in accordance with the present invention. The encoder 200 includes shift register memory units 205, 210, 215, as well as summers 220, 225. A one-bit input is encoded into a two-bit output to provide rate ½ encoding.

Assuming an initial state of 000 (i.e., the register units 205, 210, 215 contain bit values of 0, 0, 0, respectively), and an input value of 0, the next state of the encoder 200 is 000 (a zero bit value shifts in while a zero value shifts out). Consequently, the value of the two bits at the output is 00. This is represented in the first line of the state table 230 in FIG. 2B. Note, however, that the present and next state columns only indicate two-bit values since the last state bit is always shifted out and is not significant in determining the next state. Thus, when moving from state to state, the encoder 200 can be considered to have four possible present states and four possible next states, each two-bit values. As another example, assume the encoder 200 to be in the present state 10 (i.e., the first two registers contain 1,0). An input of 1 will move the encoder 200 to a next state of 11 (i.e., the first two registers contain 1,1) and generate an output of 01 (decimal 1). This process is repeated as each successive bit enters the encoder 200 so that a state diagram can be constructed which shows the possible state transitions of the encoder 200 with the accompanying input and output values which correspond to those transitions.

Figure 3:
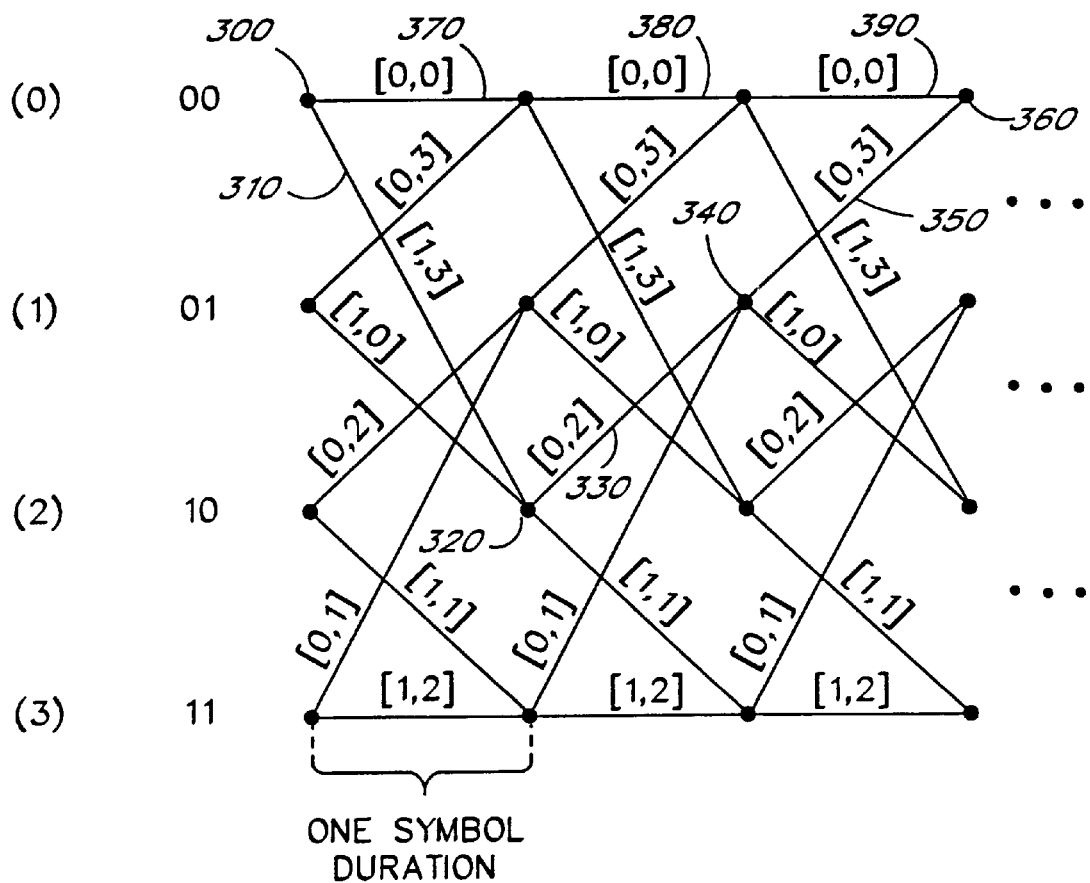
FIG. 3 is a trellis state transition diagram representing the operation of the convolutional encoder circuit of FIG. 2A.

FIG. 3 is a state transition diagram which indicates the possible state transitions of the encoder 200 of FIG. 2, along with the input and output values corresponding to the possible transitions. Because the state transition diagram resembles a trellis in form, such diagrams are often called trellis diagrams, hence the name "trellis coding." Each dot on the trellis diagram of FIG. 3 represents a state of the encoder 200. Dots in the same horizontal row correspond to the same state at different times. Dots in the same vertical column represent different states at the same time (i.e., within the duration of the same symbol). Branches between the dots represent possible state transition paths. Thus, for example, there is a branch between the state 01 and the state 00 which indicates that, given the appropriate input, the encoder 200 could go from state 01 to state 00. Since there is no branch between states 01 and 11, nor is there a branch between the states 01 and 01, it is not possible for the encoder 200 to go from state 01 to either of the states 11 or 01 within one symbol duration.

The number pair along each of the branches depicted in FIG. 3 indicate the [input, output] values which correspond to a given branch. The first number represents the input which causes the transition, while the second number represents the output value resultant upon this transition.

As seen from the trellis diagram of FIG. 3, the possible state transitions for the encoder 200 are the same for each successive symbol. Thus, the same pattern repeats over and over again for each symbol duration.

As an example, assume the encoder 200 begins in the state 0 (binary 00), represented by a dot 300 in FIG. 3. Upon application of an input value 1 to the encoder 200, the encoder 200 goes from state 0 to state 2 (binary 10), represented by a dot 320, via a path 310. Upon completion of the transition, the encoder 200 outputs a value 3 (binary 11). If the value of the next bit applied to the input is 0, then the encoder 200 transitions from state 2 to state 1, represented by a dot 340, via a path 330, while the output of the encoder 200 assumes a value of 2. Finally, upon application of an input bit of 0, the encoder 200 moves from the state 1 to the state 0, represented by a dot 360, via a path 350. Upon entering the state 0, the encoder 200 outputs a value 3. Thus, in the foregoing example, input bits 1-0-0 are encoded by the encoder 200 into output bits 11-10-11, or 3-2-3 in decimal. At the same time, the encoder 200 has transitioned from the state 0 to the state 2, to the state 1, and back to the state 0.

Maximum Likelihood Viterbi Decoding

As further explained below, convolutional encoding (and Viterbi decoding) provides for a reduced number of detected errors at the receiver. Consider again the trellis diagram of FIG. 3. For example, assume that a three-bit data stream 1-0-0 is properly encoded as 11-10-11 by the encoder 200 as described above. Also suppose that the receiver detects the transmitted signal erroneously as 11-11-11. In order to determine what the original transmitted data is, the decoder performs a maximum likelihood decision based upon the possible state transition paths which the encoder 200 might have taken. Since the encoder is typically set to state 0 at initialization, the decoder assumes that the detected sequence of data bits began in state 0. The decoder then examines all of the paths which began at state 0 and terminate at a state three symbols later as depicted in FIG. 3 for the purpose of illustration. For instance, for an ending point at the state 0, at the point 360, there are two possible paths which the encoder may have taken: the path 310, 330, 350, or the path 370, 380, 390. Of course, all the other paths of three symbol duration are also examined to determine the likelihood that the detected bit sequence followed these possible paths, but for the sake of simplicity of illustration, only the paths from state 0 to state 0 are considered here.

In order to identify the most likely path, the decoder determines the probability that the detected data sequence was produced by the first path (e.g., the path 310, 330, 350), the probability that the detected data sequence was generated by the second path (e.g., the path 370, 380, 390), and so on until a probability has been calculated for each possible path. The path having the highest probability is then selected as the actual path according to either hard or soft decision methods described in greater detail below.

Typically, trellis decoding techniques calculate path probabilities based upon either Hamming or Euclidean distances between the detected signal and the signals generated by the possible trellis paths. In accordance with the teachings of the present invention, Euclidean distances are used as the measure of path probability, as discussed in greater detail below. However, in order to provide a clearer understanding of the method of determining the probability of a possible trellis path, a brief discussion of Hamming distance is also provided.

Hamming Distance (Hard Decision Decoding)

Hamming distance is defined as the number of bits by which two binary sequences differ. For example, the hamming distance between the binary words 110 and 101 is two, while the hamming distance between the binary words 111 and 011 is one, etc. Based upon a Hamming distance evaluation of the possible paths, the probability that a given path has generated a detected data sequence can be determined as follows. Assuming, as stated above, that the detected data sequence is 11-11-11 (with a proper data sequence of 11-10-11), and the possible paths are the paths 310, 330, 350 and 370, 380, 390, the Hamming distance between the detected signal 11-11-11 and the path 310, 330, 350 is 1. That is, because the path 310 generates an output of 3 (11), the path 330 generates an output of 2 (10), and the path 350 generates an output of 3 (11), the binary sequence generated by the path 310, 330, 350 is 11-10-11. This sequence differs from the detected sequence 11-11-11 by a Hamming distance of 1. The Hamming distance between the detected signal 11-11-11 and the signal generated by the path 370, 380, 390 is 6 since the path 370, 380, 390 results in an output binary sequence of 00-00-00. Thus, it is much more likely that the detected sequence 11-11-11 was generated by the path 310, 330, 350, than by the path 370, 380, 390. Therefore, it is more likely that the sequence of input bits is 1-0-0.

Euclidean Distance (Soft Decision Decoding)

Another measure of the probability that a given path has generated a binary sequence is based upon Euclidean distance. Euclidean distance is the length of a straight line between points on a signal constellation. In general, probability measures based upon Euclidean distances exhibit better accuracy than probability measures based upon Hamming distance. This is because probability measurements based upon Euclidean distance take into account the received signal phase and amplitude information which is discarded when using Hamming distance as a probability metric. For example, FIGS. 4A–4D illustrate a simple 4-PSK modulation signal constellation having four defined points 400, 410, 420, 430 equidistant from the origin and corresponding to output values 00, 01, 10, and 11, respectively. Suppose a sequence of received data symbols are detected to have phase and amplitude values which are represented by the vectors r1–r3 in FIGS. 4A–4C. Using conventional Hamming decoding techniques, the vectors r1–r3 would simply be approximated as the data points 00, 10, and 00, respectively, so that valuable phase and amplitude information is lost about the actually detected signal sequence. In accordance with Euclidean techniques, however, the phase and amplitude of the received signal are factored into the determination of the path probability.

Figure 4A:
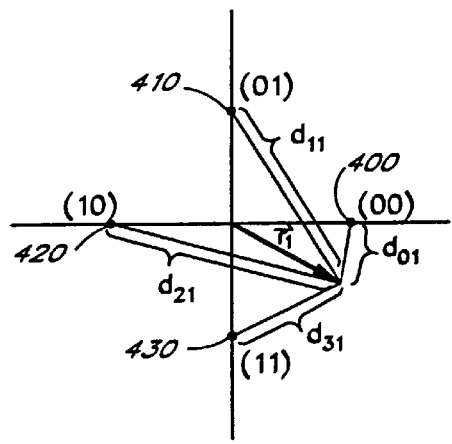
FIGS. 4A–4C are 4-PSK signal constellations which illustrate the method used to determine trellis path probabilities according to Euclidean distances along a trellis diagram represented in FIG. 4D.
Figure 4B:
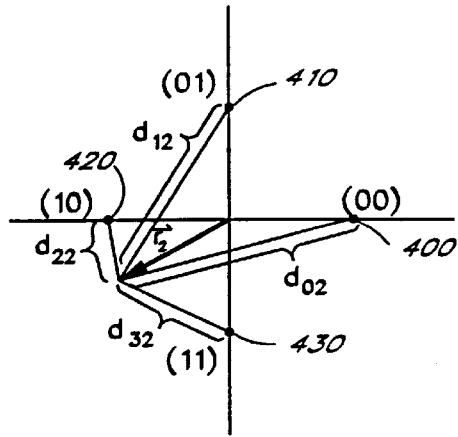
Figure 4C:
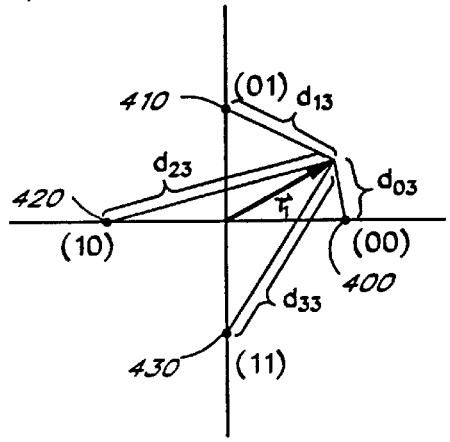
Figure 4D:
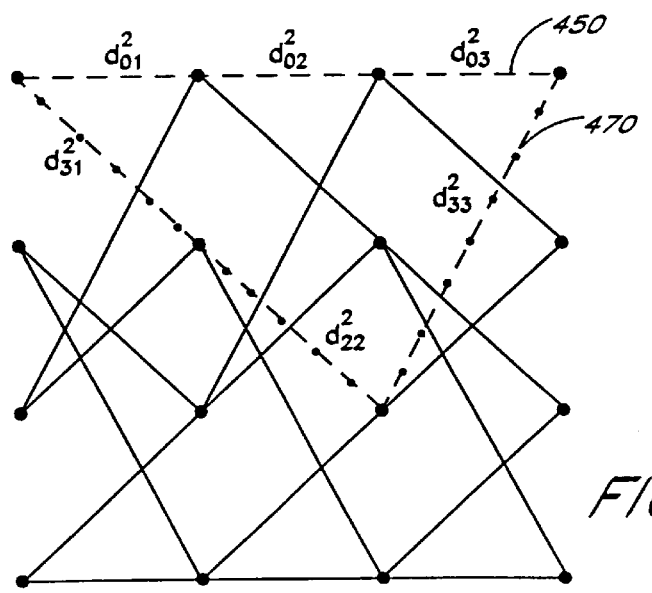

As shown in FIG. 4D, the probability that the detected signal has been generated by the trellis path represented by the dashed line 450 is a decreasing function of the sum of the squares of the Euclidean distances d01, d02, and d03 (depicted in FIGS. 4A–4C), while the probability that the detected signal has been generated by the trellis path represented by the dashed/dotted line 470 is a function of the sum of the squares of the Euclidean distances d31, d22, and d33. The greater the sum of the squares of the Euclidian distances along a given path, the less likely that path is to be the one which generated the detected signal sequence. In this manner, a more accurate estimation of the transmitted data sequence can be obtained.

It should be understood, of course, that as the number of points in the signal constellation (i.e., the number of possible output values) and the number of states in the trellis encoder increase, the number of possible trellis paths increases as well. Thus, for example, a rate ¾ trellis encoder which operates in conjunction with a 16 point constellation will have 8 possible branches merging into and diverging out of each state (represented by a point) on the trellis state transition diagram. In these systems, the probability associated with each path merging into a state point is determined. Once these probabilities have been compared, the path with the highest probability is determined and the corresponding data bits in that path are selected as the decoded sequences.

Block and Symbol-By-Symbol Decoding Methods

The selection of a given path may be made in accordance with block or symbol-by-symbol decision methods. In the case of a block decision, a predetermined number of received signals forming a set (e.g., 1,000 symbols) are fed into the decoder. The decoder then starts with the first signal and constructs a trellis with associated metrics and path histories for the whole set of 1,000 symbols. The trellis transition path that is most probable is then selected as the path which generated the detected symbols. The data input which would have generated this path is then determined as the decoded data sequence. Absent any uncorrected errors, this data sequence should correspond to the data sequence fed into the encoder on the transmitter side of the communication system. The process is then repeated with the next block of symbols, and so on.

For symbol-by-symbol decisions, a predetermined number of received signals are fed into the decoder. For example, assume 25 signals are fed into the decoder. Once the 25th symbol is entered, the trellis decoder determines what path was most probable. The input symbol which would have generated the first branch of the most probable path is then selected as the output of the decoder. The next (e.g., the 26th) received signal is then fed into the decoder and another determination is made of the most probable path for the last 25 symbols (i.e., excluding the first symbol). The input symbol which would have generated the first branch of the most probable path (i.e., the path for the most recently detected 25 symbols) is then selected as the next output of the decoder. This procedure is carried on symbol-by-symbol in real time so that only one symbol at a time is decoded for output as opposed to an entire block of data at a time.

Maximizing Euclidean Distance in Trellis Coding

Gottfried Ungerboeck, in a paper entitled "Channel Coding with Multilevel/Phase Signals," published January, 1982 in IEEE TRANSACTIONS ON INFORMATION THEORY, Vol. IT-28, No. 1, and herein incorporated by reference, argued that error performance of convolutional codes could be improved if designed by maximizing the Euclidean distances between trellis paths which merge into and out of the same state. This is accomplished by tailoring the convolutional coding scheme to the signal constellation of a given modulation technique so that the operations of error coding and modulation are essentially combined.

Figure 5:
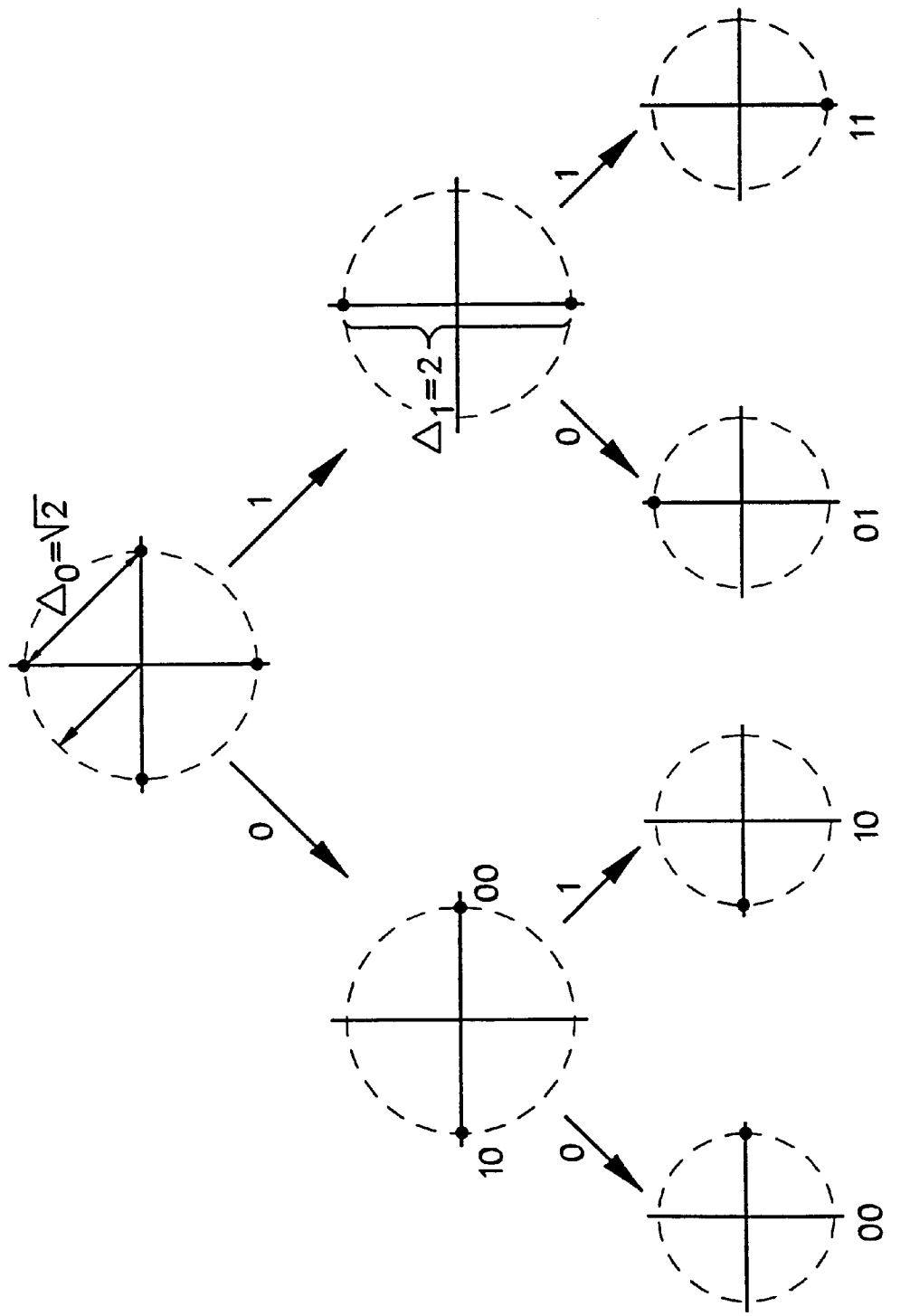
FIG. 5 is a trellis set partitioning tree for a 4-PSK signal constellation.

Take as a simple example a 4-PSK signal constellation as shown in FIG. 5. The possible outputs of the trellis encoder on the transmitter side are represented as four points which are phase shifted from one another by phase differences of 90°. In any trellis coding scheme the possible output values, as represented in the signal constellation, as well as the states of the trellis decoder are both considered. In order to provide the maximum distinction between encoded signals, so as to allow for more accurate decoding, it is advantageous to assure that transitions to and from the same state differ greatly in their output values (in terms of their Euclidean distances). For example, the trellis diagram of FIG. 3, which may, for example, describe state transitions for the 4-PSK signal constellation of FIG. 5, has the branches 370, 310 diverging from the same state point 300. Note that the output value for the state transition branch 310 is 3, and the output value for the state transition branch 370 is 0. In accordance with the Ungerboeck teaching, these two output values differ by the maximum Euclidean distance (i.e., a Euclidean distance of $\Delta=2$ as represented in FIG. 5). In a similar way, state transitions resulting in the same output values are assigned as transitions between two different states. Note, for instance, that the transition path 310 which results in an output value of 3 advances from state 00 to state 10, while a transition path 395 which also results in an output value of 3, advances from state 01 to state 00. The Ungerboeck method thus assures good discrimination between the encoded data signals.

The most common method of trellis encoding in accordance with Ungerboeck's teachings is set partitioning, of which a simple example is shown in FIG. 5. By partitioning the original 4-PSK signal into two sets of diametrically opposed 2-PSK signals based upon the state of the trellis encoder, the maximum Euclidean distance can be maintained between outputs merging into or diverging out of the same state. Such set partitioning diagrams are commonly referred to as trellis coding trees.

Figure 6:
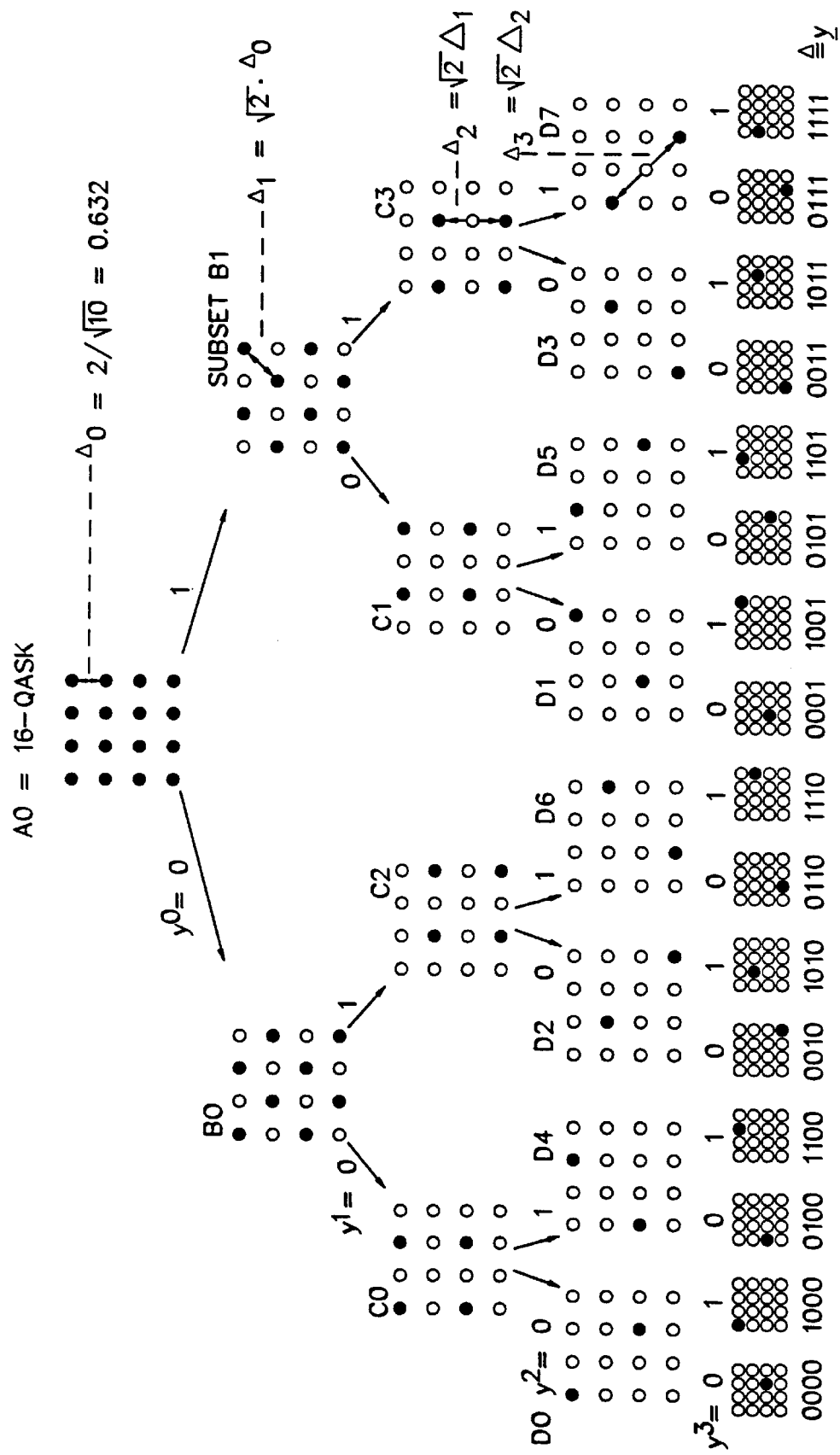
FIG. 6 is a schematic representation of a trellis coding tree which graphically depicts the signal constellation space for a conventionally encoded Square 16 QAM signal constellation at each level of trellis coding.

FIG. 6 graphically represents a trellis coding tree for set partitioning a more complicated Square 16 QAM signal constellation by the Ungerboeck method, which is well known in the art. As shown in FIG. 6, a complex signal constellation is broken up into subsets. It is a requirement of Ungerboeck's set partitioning method that the minimum Euclidean distances measured between any of the points on the subset constellations exceed the minimum Euclidean distance between points on the constellation from which the subsets are derived. Thus, for example, as shown in FIG. 6, the minimum Euclidean distance between any two points on the original constellation at the top of the trellis coding tree is less than the minimum Euclidean distance between any points of the constellation shown in subsets $B_0$ or $B_1$. In like fashion, the minimum Euclidean distances between any two points on the constellation subsets $C_0$ and $C_2$ is greater than the minimum Euclidean distance between any two points in the subset $B_0$, and so on. As detailed above, an increased minimum Euclidean distance between any two points in a signal constellation insures that the probability of mistaking similar encoder output sequences is minimized. The error performance of the coded scheme is a function of the minimum Euclidean distance between any two given paths. To reduce the probability of error, the minimum Euclidean distance must be increased.

Difficulty of Set Partitioning Certain Signal Constellations

Figure 7:
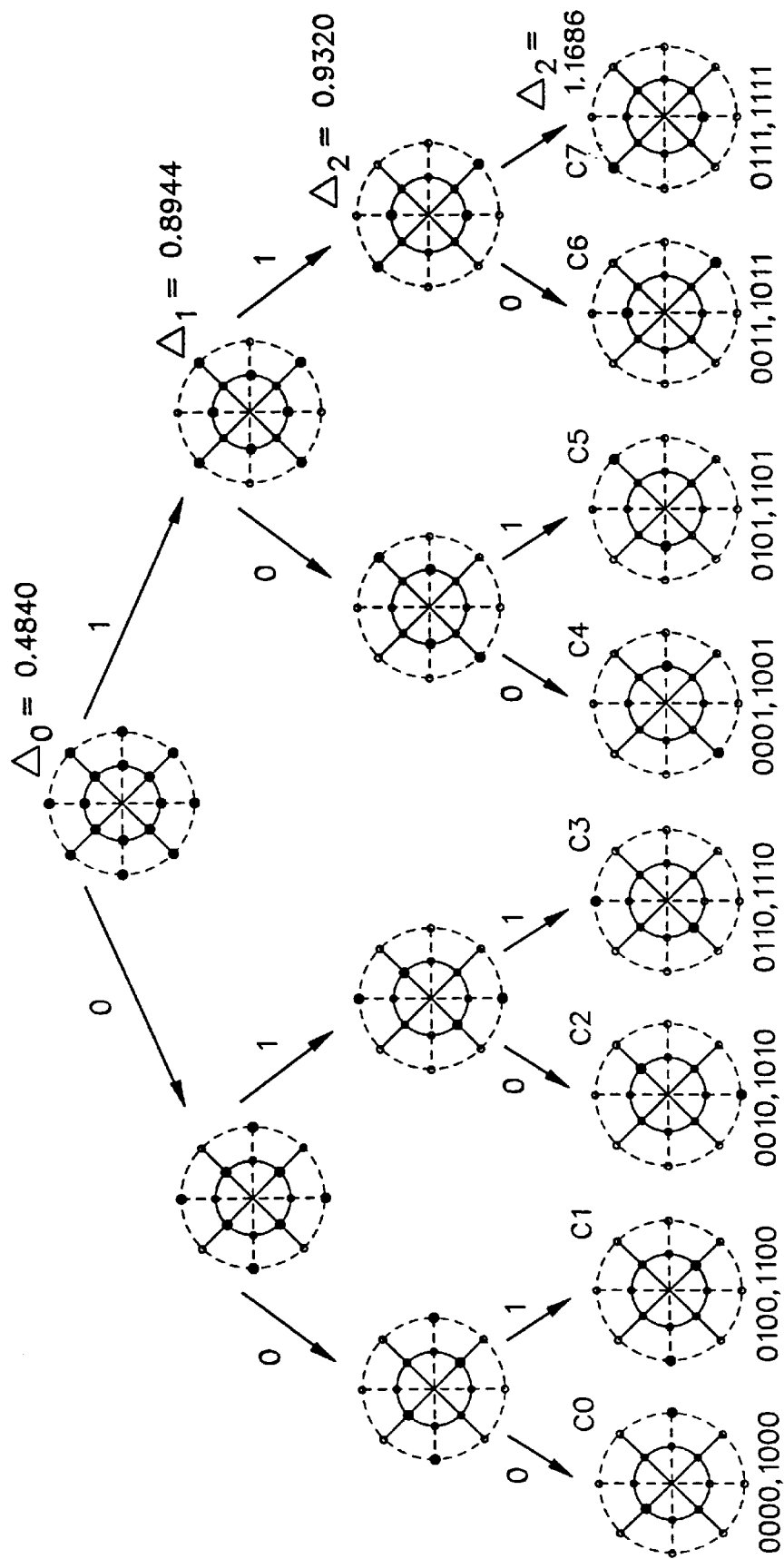
FIG. 7 is a schematic representation of a trellis coding tree which graphically depicts the signal constellation space for a 16 Star QAM signal constellation at each level of trellis coding in accordance with the method of the present invention.

Unlike the Square 16 QAM signal constellation, the 16 Star QAM signal constellation does not allow for division into subsets such that the minimum Euclidean distance between points increases significantly for each level of partitioning. FIG. 7 illustrates the difficulty of set partitioning the 16 Star QAM signal constellation. For the first level of set partitioning there is no difficulty; the constellation divides symmetrically, and the minimum Euclidean distance between the point on the first subset is considerably greater than the minimum Euclidean distance between the points on the original constellation. However, at the second level of set partitioning, the minimum Euclidean distances are substantially the same as at the first level of set partitioning. Due to this characteristic of the 16 Star QAM signal constellation, it has been thought that it is not possible to effectively trellis code a 16 Star QAM signal using conventional Ungerboeck coding techniques.

The present invention includes a specially designed trellis encoder/decoder within a transmit/receive communications system which solves the problems associated with the set partitioning of the 16 Star QAM constellation. The encoder/decoder is constructed to encode according to an inventive method called cyclic trellis coding which has been found to work advantageously for signal constellations such as 16 Star QAM or any arbitrary signal constellation. Cyclic trellis coding is described in detail below.

CYCLIC TRELLIS CODING

Cyclic trellis coding in accordance with the present invention involves a method of error encoding which may be adapted to the 16 Star QAM signal constellation. In addition, cyclic trellis coding according to the present invention can be applied to modulation schemes with any signal constellation that can be partitioned into two symmetric subsets. Moreover, it has been verified that error performance of a system using cyclic trellis coding, together with a 16 level modulation scheme, is as good or better than systems employing the previously used Ungerboeck codes for trellis encoders having up to 16 states.

The main criteria for the design of cyclic trellis codes is to maximize the distance between the output signals on the branches of a trellis merging into or out of the same state, and to have a regular code structure so that codes of varying constraint length and modulation can be constructed without extensive searches. The cyclic trellis codes have very predictable and regular distance profiles. Cyclic trellis codes are also systematic codes. That is, the first n bits of the n+1-bit encoded output symbol are identical to the corresponding n-bit symbol input into the encoder.

Simplified Cyclic Trellis Coding Communication System

Figure 8:
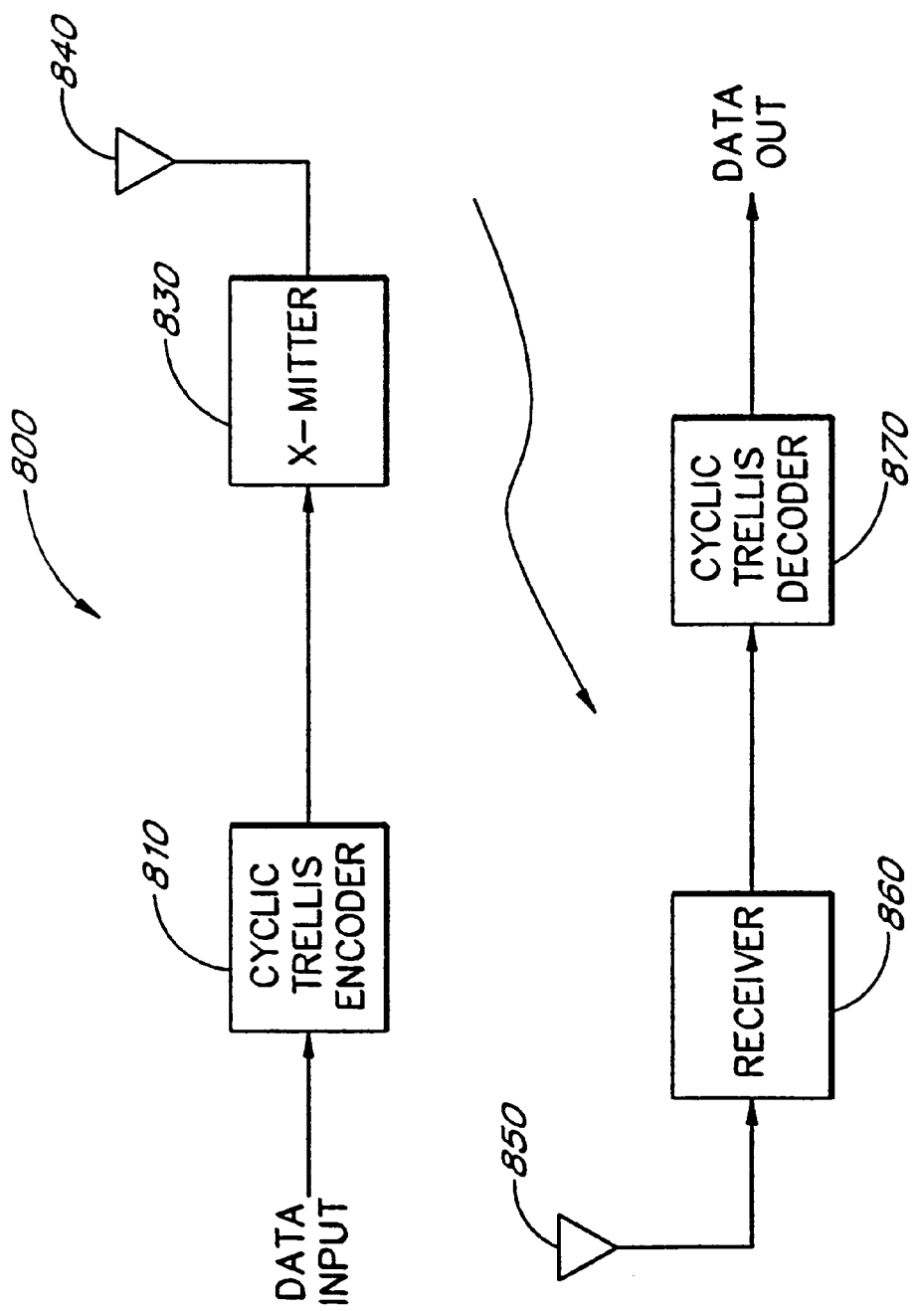
FIG. 8 is a simplified block diagram of a wireless communication system which employs cyclic trellis error encoding.

FIG. 8 depicts a simplified block diagram showing the main functional elements of a communication system 800 which employs cyclic trellis coding in accordance with the teachings of the present invention. As will be appreciated by those of ordinary skill in the art, the system 800 depicted in FIG. 8 is highly simplified and does not show block interleaving elements, synchronization insertion and detection elements, filtering elements, and other elements which are typically associated with digital communication systems. The system 800 includes a cyclic trellis encoder 810 which couples to a transmitter 830. The transmitter 830 transmits radio frequency (RF) signals over an antenna 840. The RF signals are is received via a communication channel by an antenna 850 which passes the signals to a receiver 860. The receiver connects to a cyclic trellis decoder 870.

In operation, the cyclic trellis coding system 800 receives data which is to be encoded. The data is then cyclicly encoded within the encoder 810 according to the method described with reference to FIGS. 13–15 below. Once the data has been encoded, the encoder 810 then maps the encoded data into the appropriate signal constellation by introducing the appropriate phase and amplitude variations in the signal to encode the signal according to a particular modulation scheme (e.g., 8-PSK, 16 Star QAM, etc.). Once the signal is mapped, the signal is communicated to the transmitter 830, which transmits the signal over the communication channel via the antenna 840. The antenna 850 receives the signal; the receiver 860 detects the signal on the carrier and outputs the detected signal at the baseband level. Finally, the cyclic trellis decoder 870 decodes the received baseband signal and outputs data corresponding to the data input at the transmitter side.

Method of Cyclic Trellis Encoding

To cyclic trellis encode a signal in accordance with the present invention, the signal constellation is first partitioned into two sets. This is the same as dividing the possible outputs of the encoder into two sets of output values. The sets into which the output symbols are partitioned depend upon the particular mapping scheme. The mapping scheme which is used depends upon the particular application of the communication system. For applications involving mobile radio communications characterized by Rician or Rayleigh fading, the signal mapping, and hence the set partitioning, is performed according to Gray coding. For wireline applications, or any other applications, where the primary channel impairment is that of AWGN, the signal mapping, and hence the set partitioning, is performed according to natural mapping.

The possible states of the encoder are also divided into a number of sets. The output and state partitioning is most readily represented in table form. Because a trellis code is entirely determined by five factors (i.e., the input, the present state, the next state, the output, and the signal mapping) a trellis code can be wholly represented by two tables, and a signal mapper. The first table represents the encoder output as a function of the present state of the encoder and the input applied to the encoder. The second table represents the next state of the encoder as a function of the present state of the encoder and the input applied to the encoder. The signal mapper determines the coordinates of the output symbols in the signal constellation. For the sake of clarity, because the method of cyclic trellis coding is somewhat universal, the following description proceeds inductively with the presentation of specific examples followed by a summary of the universal method of the present invention.

16 State Cyclic Trellis Code for 8-PSK Signals in AWGN

Figure 9:
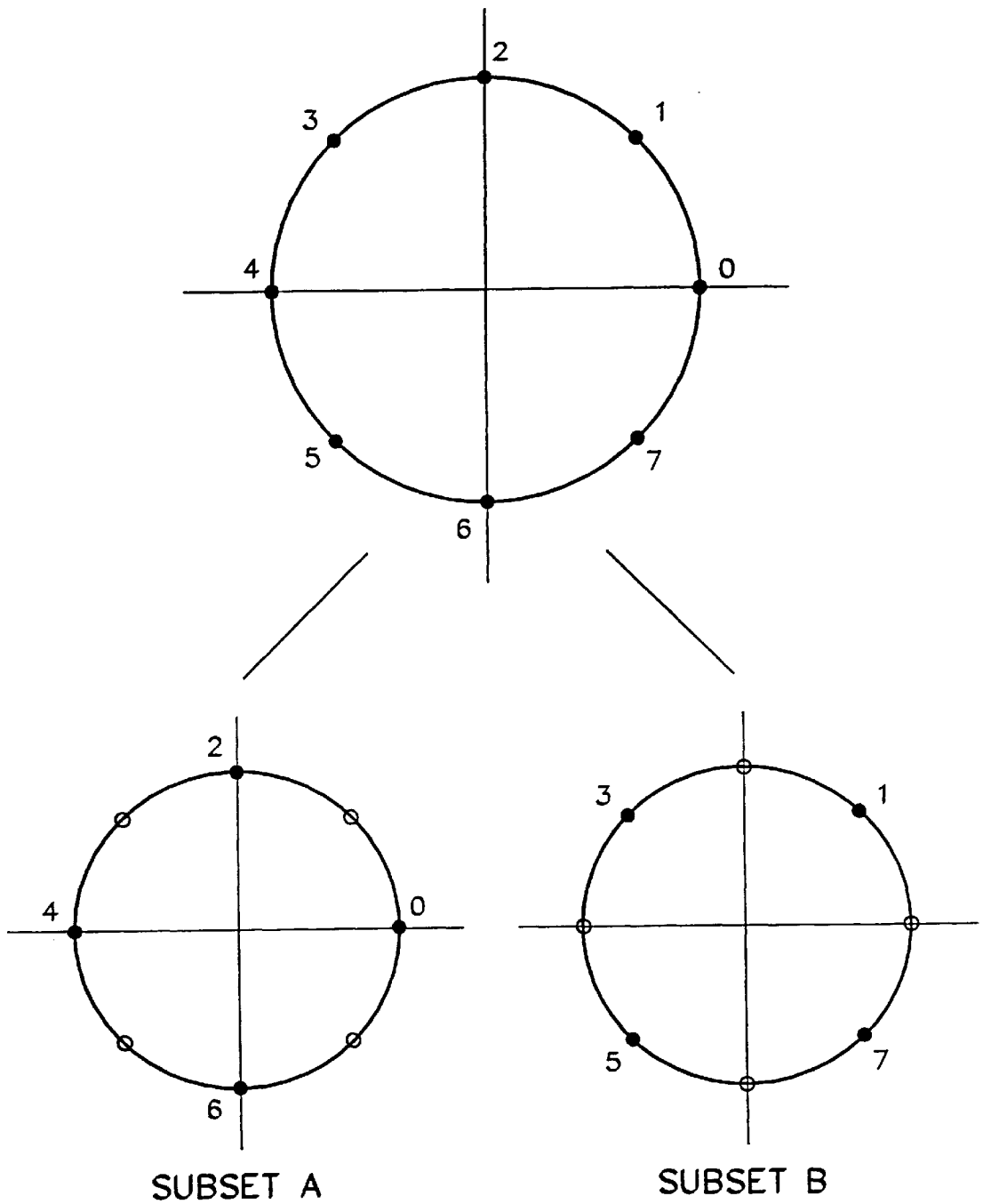
FIG. 9 depicts a single level set partitioning of an 8-PSK signal constellation coded by natural coding techniques.

FIG. 9 depicts a one level partitioned 8-PSK signal constellation with natural mapping for AWGN applications. As stated above, applications wherein AWGN is the primary channel impairment require that the output table be defined in accordance with a naturally mapped signal constellation. In natural mapping a reference point is chosen on the signal constellation and it is assigned to symbol 0. The remaining signals are then numbered consecutively around the constellation.

The tables shown in FIGS. 10 and 13 define the rate $\frac{2}{3}$, 16-state cyclic trellis code for 8-PSK signals in AWGN. A generalized version of such an encoder is shown below, and described in detail with reference to FIG. 21. FIG. 10 depicts an encoder output look-up table which defines the encoder output value given the present state of the encoder and the input applied to the encoder. FIG. 13 depicts a next-state look-up table which defines the next state of the encoder given the present state of the encoder and the input applied to the encoder. Since, in the present example, the encoder is a rate $\frac{2}{3}$ encoder there are two input bits and three output bits corresponding to four possible input values and eight possible output values as depicted in FIG. 10. Thus, for example, when an input of 2 (binary 10) is applied to a cyclic trellis encoder presently in the state 9 (binary 1001), the encoder outputs a value of 5 (binary 101). That is to say, the encoder encodes the output symbol such that the symbol is mapped onto the point having a value of 5 on the natural-coded 8-PSK signal constellation. Once the symbol corresponding to a value of 5 is output from the encoder, the encoder moves from the state 9 to the state 4, as represented in the table of FIG. 13.

As stated above, the cyclic trellis encoding method of the present invention is used to encode signals as defined by the tables shown in FIGS. 10 and 13. First, the possible output values of the encoder are partitioned into two sets wherein the first set comprises all of the output values of the subset A (see FIG. 9), and the second set comprises all of the output values of the subset B (FIG. 9). Thus, in accordance with natural mapping, the first set comprises all of the even output values and the second set comprises all of the odd output values. For each even present state value, an even output value is generated upon application of an input value, such that input values in ascending order (i.e., 0, 1, 2, 3) generate even output values in ascending order (i.e., 0, 2, 4, 6). In like fashion, for each odd present state value, an odd output value is generated upon application of an input value, such that input values in ascending order (i.e., 0, 1, 2, 3) generate odd output values in ascending order (i.e., 1, 3, 5, 7). This form carries through each of the present state values, as represented in FIG. 10.

16 State Cyclic Trellis Code for 8-PSK Signals in Rayleigh Fading

Figure 11:
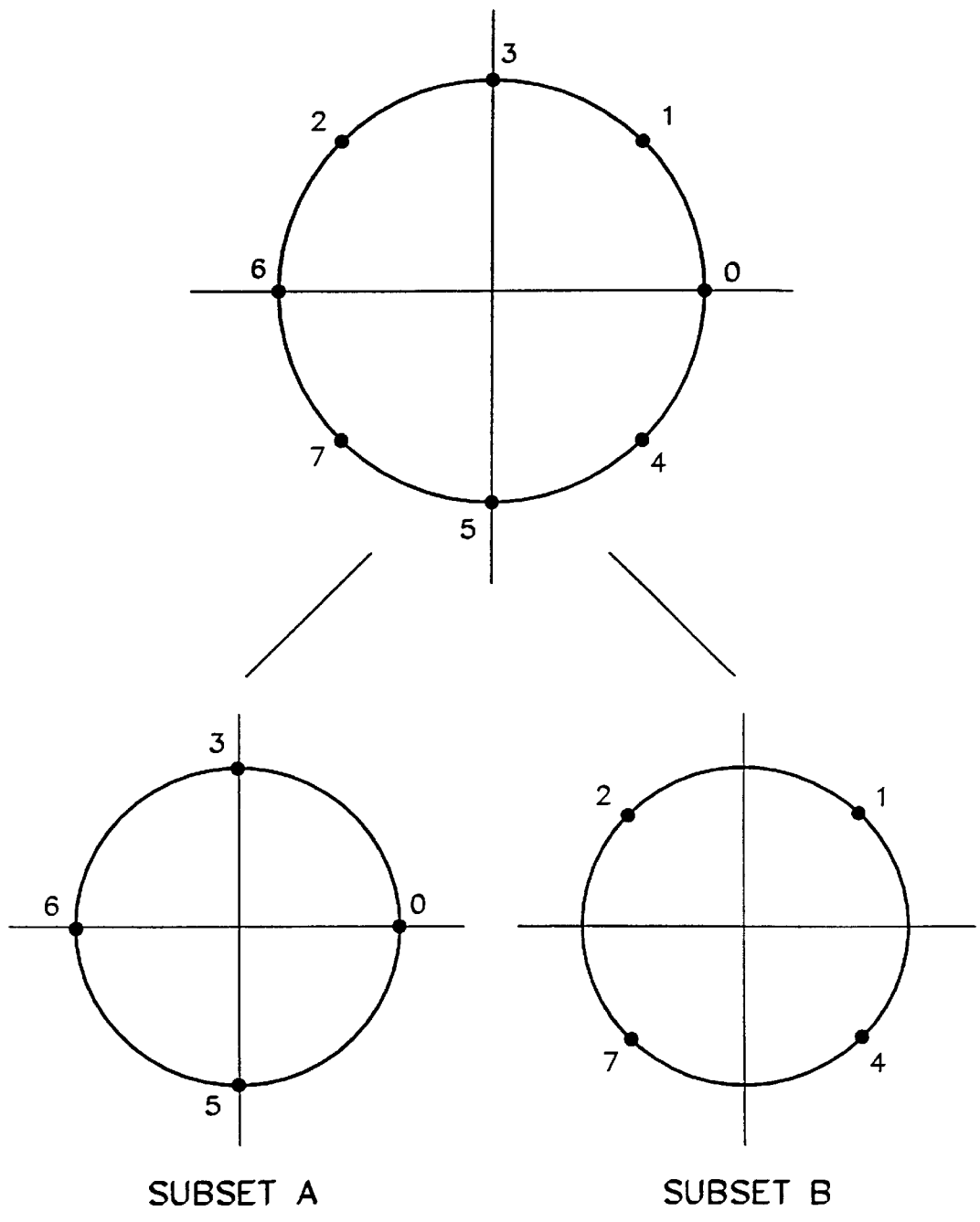
FIG. 11 depicts a single level set partitioning of an 8-PSK signal constellation coded by Gray coding techniques.

FIG. 11 depicts a one level partitioned 8-PSK signal constellation with Gray-coded mapping for Rayleigh fading applications. As stated above, for wireless communications applications, the mapping scheme is that of Gray coding. As is well known in the art, Gray coding is a method whereby signal constellation points are assigned binary data values such that the Euclidean distances between points in adjacent signal constellations correspond to a Hamming distance of one.

The tables shown in FIGS. 12 and 13 define the rate ⅔, 16-state cyclic trellis code for 8-PSK signals in Rayleigh fading. FIG. 12 depicts an encoder output look-up table which defines the encoder output value given the present state of the encoder and the input applied to the encoder. Since, in the present example, the encoder is a rate ⅔ encoder there are two input bits and three output bits corresponding to four possible input values and eight possible output values as depicted in FIG. 12. Thus, for example, when an input of 2 (binary 10) is applied to a cyclic trellis encoder presently in the state 9 (binary 1001), the encoder outputs a value of 4 (binary 100). That is to say, the encoder encodes the output symbol such that the symbol is mapped onto the point having a value of 4 on the Gray-coded 8-PSK signal constellation. Once the symbol corresponding to a value of 4 is output from the encoder, the encoder moves from the state 9 to the state 4, as represented in the table of FIG. 13.

As stated above, the cyclic trellis encoding method of the present invention is used to encode signals as defined by the tables shown in FIGS. 12 and 13. First, the possible output values of the encoder are partitioned into two sets wherein the first set comprises all of the output values of the subset A (see FIG. 11), and the second set comprises all of the output values of the subset B (FIG. 11). Thus, for even present states (i.e., 0, 2, 4, . . . 14), in accordance with Gray-coded mapping, an output value is generated upon application of an input value such that input values in ascending order (i.e., 0, 1, 2, 3) generate the output values from the subset A in ascending order (i.e., 0, 3, 5, 6). In like fashion, for each odd present state value, an output value is generated upon application of an input value, such that input values in ascending order (i.e., 0, 1, 2, 3) generate output values from the subset B in ascending order (i.e., 1, 2, 4, 7).

When the output value is generated by the encoder as defined by the output look-up table of either FIG. 10 or 12 (as called for by the specific application), the encoder goes to the next state as defined by the state transition or next-state look-up table of FIG. 13. Although the form of the output look-up table is dependent upon the specific application (i.e., either AWGN or Rayleigh fading applications), the next-state look-up table of FIG. 13 does not depend upon the predominant channel impairment. The table of FIG. 13 is defined by filling up the rows of the next-state table in ascending order until the last next-state value is placed. Thus, in the table of FIG. 13, the first row is filled from 0 to 3, the second row is filled from 4 to 7, the third row is filled from 8 to 11, and the fourth row is filled from 12 to 15. The entire pattern is then repeated with one modification: each row is cyclicly shifted by one place, so that the last value in the row becomes the first, and the other values retain their order but are shifted to the right by one space. Once all 16 states have been used (i.e., the next four rows have been filled), the pattern repeats again so that the last value is taken from the second set of four rows and is placed in the first position while each of the other values is shifted over by one place. This procedure is repeated until all of the present state value rows have been defined. Once the next-state look-up table has been defined, the table can be implemented within an encoder, as described in more detail below, by means of look-up table read only memories (ROMs), software, or other means as called for by the particular application.

16 State Cyclic Trellis Code for 16 Star QAM Signals in AWGN

Figure 14:
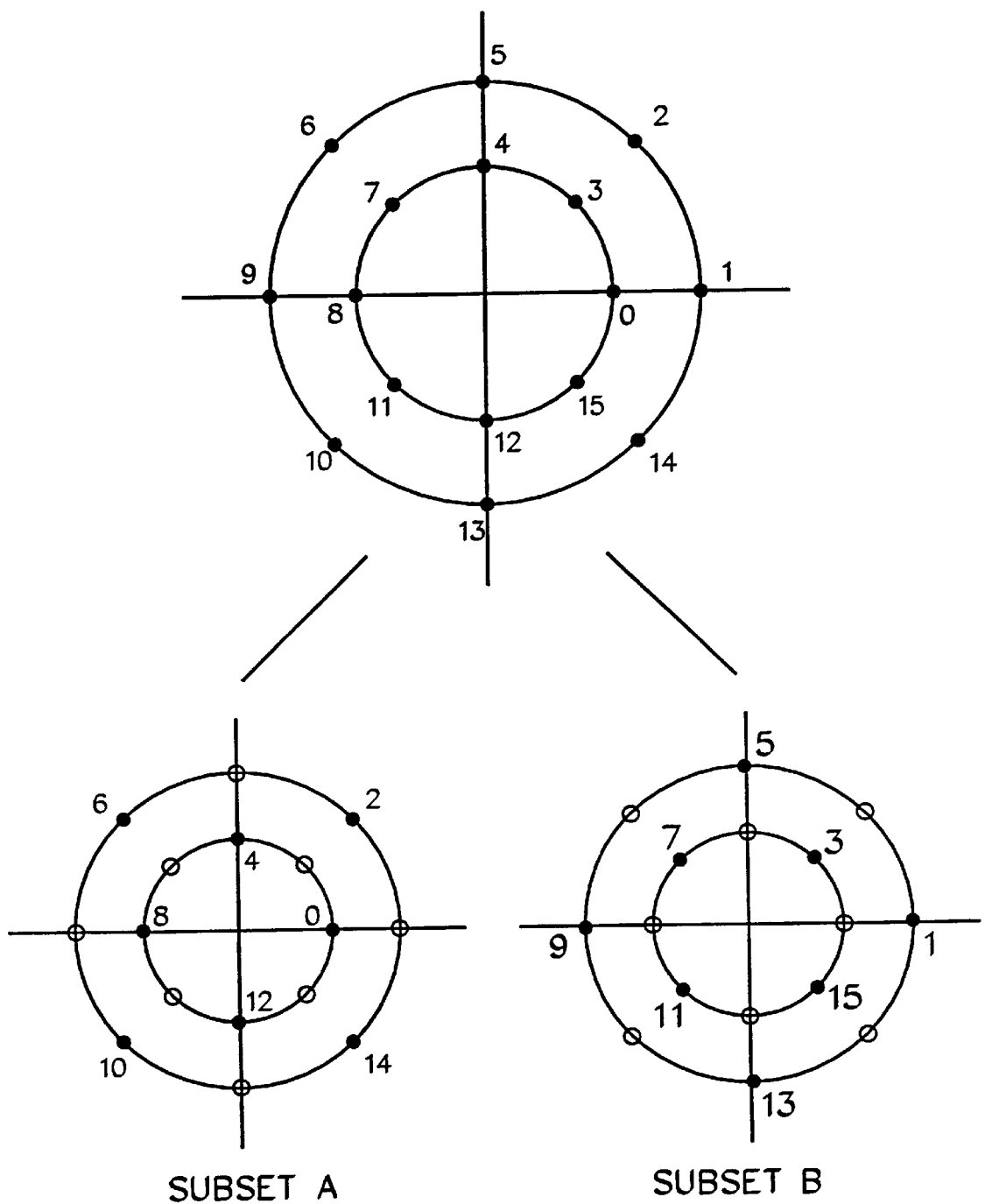
FIG. 14 depicts a single level set partitioning of a 16 Star QAM signal constellation coded by natural coding.

FIG. 14 depicts a one level partitioned 16 Star QAM signal constellation with natural mapping for AWGN applications. Output and next-state tables to define a cyclic trellis encoder for coding of a 16 Star QAM signal in AWGN are depicted in FIGS. 15 and 18. The table shown in FIG. 15 presents the output values as a function of the input and the present state values, while the table shown in FIG. 18 presents the next-state values as a function of the input and present state values.

In accordance with the teachings of the present invention, a rate ¾ cyclic trellis encoder for encoding a 16 Star QAM signal in AWGN partitions the output values into two sets, as represented in the table of FIG. 15. As is well known in the art, a rate ¾ trellis encoder receives 3 input lines (corresponding to 8 possible input values) and generates outputs on four lines (corresponding to 16 possible output values). For this particular embodiment of the present invention, it has been found that a 16 state encoder is advantageous, so that there are 16 present state values and 16 next-state values. As shown in the table of FIG. 15, each of the even present state values generates an output value from the subset A (see FIG. 14) upon the application of an input value. Similarly, each of the odd present state values generates an output value from the subset B (FIG. 14) upon the application of an input value. Thus, in accordance with natural mapping, for each even present state value, an even output value is generated upon application of an input value, such that input values in ascending order (i.e., 0, 1, 2, . . . , 6, 7) generate even output values in ascending order (i.e., 0, 2, 4, . . . , 12, 14). In like fashion, for each odd present state value, an odd output value is generated upon application of an input value, such that input values in ascending order (i.e., 0, 1, 2, . . . , 6, 7) generate odd output values in ascending order (i.e., 1, 3, 5, . . . , 13, 15). For example, if the trellis encoder is presently in state 7 (binary 0111) and an input of 4 (binary 0100) is applied, the output value produced by the encoder will be 9 (binary 1001).

16 State Cyclic Trellis Code for 16 Star QAM Signals in Rayleigh Fading

Figure 16:
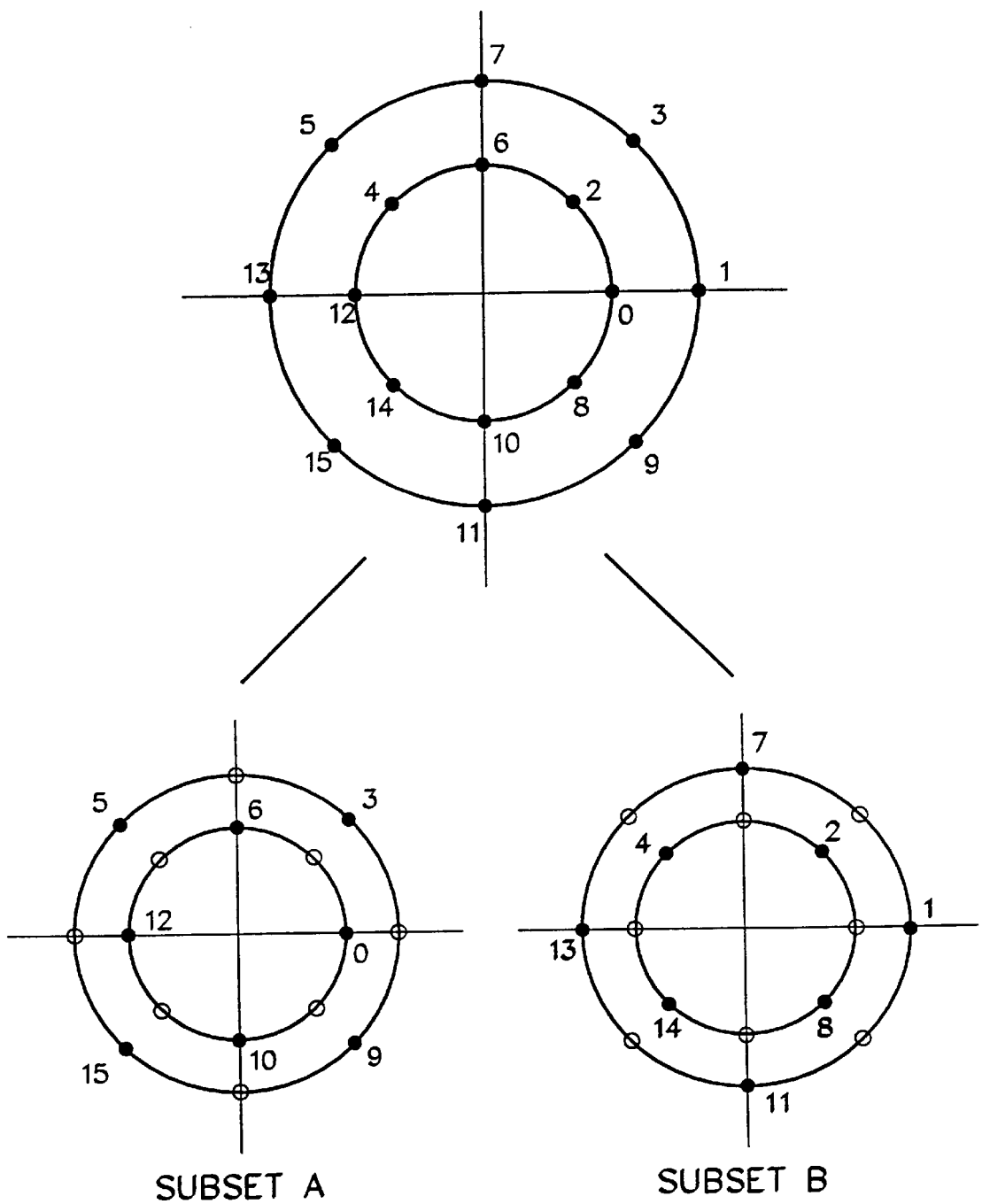
FIG. 16 depicts a single level set partitioning of a 16 Star QAM signal constellation coded by Gray coding techniques.

FIG. 16 depicts a one level partitioned 16 Star QAM signal constellation with Gray-coded mapping for Rayleigh fading applications. Output and next-state tables to define a cyclic trellis encoder for coding of a 16 Star QAM signal in Rayleigh fading are depicted in FIGS. 17 and 18. The table shown in FIG. 17 presents the output values as a function of the input and the present state values.

In accordance with the teachings of the present invention, a rate ¾ cyclic trellis encoder for encoding a 16 Star QAM signal in Rayleigh fading partitions the output values into two sets, as represented in the table of FIG. 17. Each of the even present state values generates an output value from the subset A (see FIG. 17) upon the application of an input value. Similarly, each of the odd present state values generates an output value from the subset B (FIG. 17) upon the application of an input value. Thus, in accordance with Gray-coded mapping, for each even present state value, an output value from the subset A is generated upon application of an input value, such that input values in ascending order (i.e., 0, 1, 2, . . . , 6, 7) generate output values from the subset A in ascending order (i.e., 0, 3, 5, 6, 9, 10, 12, 15). In like fashion, for each odd present state value, an output value from the subset B is generated upon application of an input value, such that input values in ascending order (i.e., 0, 1, 2, . . . , 6, 7) generate output values from the subset B in ascending order (i.e., 1, 2, 4, 7, 8, 11, 13, 14).

Thus, for example, if the trellis encoder is presently in state 7 (binary 0111) and an input of 4 (binary 0100) is applied, the output value produced by the encoder will be 8 (binary 1000).

The table of FIG. 18 represents the next state of a ¾ cyclic trellis encoder as a function of the input and present state values. Although the output table for the 16 Star QAM signal constellation encoder depends upon whether the communication system is to be used in an AWGN environment or a Rayleigh fading environment, the form of the next-state look-up table does not change due to the predominant channel impairment. As shown in FIG. 18, the next-state value is partitioned into multiple sets. That is, the first eight next-state values (0–7) are assigned, in order, to the first present state value, while the next eight next-state values (8–15) are assigned, in order, to the second present state value. The first eight next-state values are then assigned again to the third present state value, but this time not in order from 0 to 7. Rather, the order is 7, 0, 1, 2, 3, 4, 5, 6. Thus, the third next-state row is like the first next-state row, but cyclicly shifted to the right. This pattern is repeated between the fourth and second rows with the 15 being shifted into the first position while the 14 is shifted into the last position of the row. Stated in general form, every next-state row takes the last value from the row immediately preceding the previous next-state row and places this value in the first position while shifting the other values over by one position. This procedure is repeated until an entire next-state table is defined. Generally, the cyclic trellis codes of the present invention do not have a feed-forward or feed-back shift register implementation. However, as is well known in the art, an encoder defined by the tables in FIGS. 15 or 17, and 18 may be implemented as a look-up table, or some other input/output state machine circuit.

Cyclic Trellis Coding For Any Signal Constellation

Specific examples detailing the method of cyclic trellis coding the 8-PSK signal constellation and the 16 Star QAM signal constellation have been described above. The following description sets forth the general method used for cyclic trellis encoding data mapped into any signal constellation. As detailed in the examples above, the form of the output look-up table for any cyclic trellis coded signal constellation varies depending upon the predominant channel impairment. Thus, if AWGN is the predominant impairment, then natural coding of the signal constellation will be used to determine the output look-up table, while if Rayleigh fading is the predominant impairment, then Gray coding of the signal constellation will be used to determine the output look-up table. The form of the next-state look-up table does not vary with the predominant channel impairment so that the form of the next-state look-up table will be the same for either application.

Given a cyclic trellis encoder which receives n input bits at a time and encodes these into n+1 output bits at a time, there are $2^n$ possible input values and $2^{n+1}$ possible output values. Further, the number of states of the trellis encoder can be generally expressed as $2^k$ states, where k can be any positive integer. Thus, according to this formulation, a cyclic trellis encoder can be represented by tables (like those described above for 8-PSK and 16 Star QAM signal constellations) having $2^n$ input values, $2^{n+1}$ output values, and $2^k$ present state and next-state values. Therefore, the output table and the next state table have $2^k$ rows and $2^n$ columns.

The first step in defining a generalized encoder output table is to partition the set of $2^{n+1}$ output values into two sets. The elements in each set will depend upon whether the table is defined for AWGN applications or Rayleigh fading applications. The following description is with reference to AWGN applications where natural mapping of the signal constellation is employed. A brief description of the generalized method of defining the output look-up table for Rayleigh fading applications is provided after the detailed description of the method of defining the output look-up table for AWGN applications.

For AWGN applications, the signal constellation is mapped according to natural mapping. Once the signal constellation has been partitioned, in conjunction with natural mapping of the constellation, the first subset contains all of the even output values and the second subset contains all of the odd output values. The first set is then placed in ascending order (i.e., 0, 2, 4, ..., $2^{n+1}-4$, $2^{n+1}-2$) in all of the even present state rows. The second set is placed in ascending order (i.e., 1, 3, 5, ..., $2^{n+1}-3$, $2^{n+1}-1$) in all of the odd present state rows. Such a generalized output table is represented in FIG. 19. The output table shown in FIG. 19 may, for example, be implemented within a cyclic trellis encoder by means of a ROM look-up table, or a software look-up table, as will be described in greater detail below with reference to FIG. 21.

If the output look-up table is to be defined for Rayleigh fading applications, then the signal constellation is Gray coded. The signal constellation is then partitioned into two symmetrical subsets, A and B. The elements of the output table for even present states are those from subset A in ascending order, while the elements of the output table for the odd present states are those from the subset B in ascending order.

The form of the state transition table is the same for either AWGN applications or Rayleigh fading applications. Defining a state transition, or next-state table involves partitioning the set of $2^k$ present state values into m present state sets, where m equals $2^k/2^n$ (i.e., $m=2^{k-n}$, which is the ratio between the number of states and the number of input values). For the present example, only the case where m is greater than or equal to one is explained. Thus, the first present state set, $S_0$, contains the present state values {0, m, 2m, ..., $(2^n-1)m$}, the second present state set, $S_1$, contains the present state values {1, m+1, 2m+1, ..., $(2^n-1)m+1$}, and so on until the last set, $S_{m-1}$, which contains the present state values {m−1, 2m−1, ..., $(2^n-1)m+m-1$}. For ease of illustration, FIGS. 20A–20C illustrate state transition tables for each of the sets $S_0$–$S_{m-1}$. It should be understood, however, that the state transition tables depicted in FIGS. 20A–20C could be combined into one single state transition table, such as represented in FIGS. 10 and 15, which may be implemented within a cyclic trellis encoder by means of a software realized look-up table, a ROM look-up table, or other input/output state circuitry.

In the table depicted in FIG. 20A, the rows of the state transition table correspond to the present state values in the first present state set $S_0$. In the first row (i.e., the row corresponding to the present state 0), the first $2^n$ next-state values are assigned in ascending order from 0 to $2^n-1$. In the second row of the table of FIG. 20A (i.e., the row corresponding to the present state value m), the same next-state values are assigned for each input value. However, in row m, a cyclic shift has been performed so that the last value from row 0 is placed in the first position of row m, while each of the remaining values are then placed in ascending order, from 0 to $2^n-2$, for the remainder of row m. Another shift is performed for the next row in FIG. 20A (i.e., the row corresponding to the present state value 2m), so that the next-state values in the row 2m are $2^n-2$, $2^n-1$, 0, 1, 2, ...

, $2^n-3$. In this manner a cyclic shift is performed every row of FIG. 20A (i.e., every mth present state value) until the last present state value in the set $S_0$ is reached.

A similar procedure is used to define the tables of FIGS. 20B and 20C. In the table depicted in FIG. 20B, the rows of the state transition table correspond to the present state values in the second present state set $S_1$. In the first row (i.e., the row corresponding to the present state 1), the second $2^n$ next-state values are assigned in ascending order from $2^n$ to $2^{n+1}-1$. In the second row of the table of FIG. 20B (i.e., the row corresponding to the present state value m+1), the same next-state values are assigned for each input value. However, in row m+1, a cyclic shift has been performed so that the last value from row 1 is placed in the first position of row m+1, while each of the remaining values are then placed in ascending order, from $2^n$ to $2^{n+1}-2$, for the remainder of row m+1. Another shift is performed for the next row in FIG. 20B (i.e., the row corresponding to the present state value 2m+1), so that the next-state values in the row 2m+1 are $2^{n+1}-2$, $2^{n+1}-1$, $2^n$, $2^{n+1}+1$, $2^{n+1}+2$, ..., $2^{n+1}-3$. In this manner a cyclic shift is performed every row of FIG. 20B (i.e., every mth present state value) until the last present state value in the set $S_1$ is reached.

FIG. 20C depicts a table which generally defines the state transitions for the ith set of present state values, $S_i$. In the first row (i.e., the row corresponding to the present state i), the i+1th $2^n$ next-state values are assigned in ascending order from $2^{n+i-1}$ to $2^{n+i}-1$. In the second row of the table of FIG. 20C (i.e., the row corresponding to the present state value m+i), the same next-state values are assigned for each input value. However, in row m+i, a cyclic shift has been performed so that the last value from row i is placed in the first position of row m+i, while each of the remaining values are then placed in ascending order, from $2^{n+i-1}$ to $2^{n+i}-2$, for the remainder of row m+i. Another shift is performed for the next row in FIG. 20C (i.e., the row corresponding to the present state value 2m+i), so that the next-state values in the row 2m+i are $2^{n+i}-2$, $2^{n+i}-1$, $2^{n+i}$, $2^{n+i}+1$, $2^{n+i}+2$, ..., $2^{n+i}-3$. In this manner a cyclic shift is performed every row of FIG. 20C (i.e., every mth present state value) until the last present state value in the set $S_i$ is reached.

The foregoing description of the construction of the state transition tables of FIGS. 20A–20C has assumed that the ratio between the number of state values of the encoder and the number of input values of the encoder is greater than or equal to one (i.e., m>=1). If, however, there are more possible input values than encoder states, the following procedure should be followed to cyclicly trellis encode the incoming data signal.

The first present state row is filled by placing the next-state values in ascending order beginning at the first input value column until all of the next-state values have been placed. Since there are more input values than next-state values, the next-state values will not fill the entire first row. Thus, the next-state values are again placed in the first row in ascending order. This process is repeated until the entire first row is filled. Because the number of next-state and input values can only be a power of two, the entire set of next-state values will fit an even number of times into the first row of the state transition table so that there is no spill over into the next row. Once the first row has been filled, the second row is defined by performing a cyclic shift of the first row. The third row is defined by performing a cyclic shift on the second row, etc., until all of the rows have been filled within the state transition look-up table.

According to the above procedure, an entire next-state table is constructed which defines every next-state value as a function of the input value and the present state value. According to this method the constructed encoder output and next-state tables are general enough to be applied to any signal constellation. As indicated above, the codes generated by the above-described method of cyclic trellis coding have been found not to have a feed-forward or feedback shift register implementation. The tables may be implemented within a cyclic convolutional encoder as look-up tables, as described in detail below.

Properties of Cyclic Trellis Codes

It will be appreciated by those of ordinary skill in the art that signals coded according to the above-described technique have certain advantageous properties which provide for optimal or near optimal discrimination amongst signals output from the cyclic trellis encoder 810.

For instance, trellis state transition structures will have the minimum number of two branch paths for state transitions which originate out of one state and merge back into the same state. For example, the 16 Star QAM signal which is cyclic trellis encoded will have only four state transition paths which originate from the state zero and merge back into the state zero within two transitions (i.e., the paths from state 0 to state 0 and again to state 0; 0 to 2 back to 0; 0 to 4 back to 0; and 0 to 6 back to 0).

Another advantageous property of cyclic trellis codes is that such codes provide maximal or near maximal spacing between outputs on state transition paths which originate from one state and merge into the same state.

An additional advantageous property of cyclic trellis codes is that such codes can be constructed in a very short period of time for signal constellations of virtually any form. Typically, a cyclic trellis code can be constructed in a matter of minutes for most signal constellations while conventional simulation techniques for generating trellis codes take weeks or months by means of iterative computer searches. Thus, the cyclic trellis encoding technique of the present invention offers many significant advantages over the prior systems and methods which generate or employ trellis codes.

The Cyclic Trellis Encoder

Figure 21:
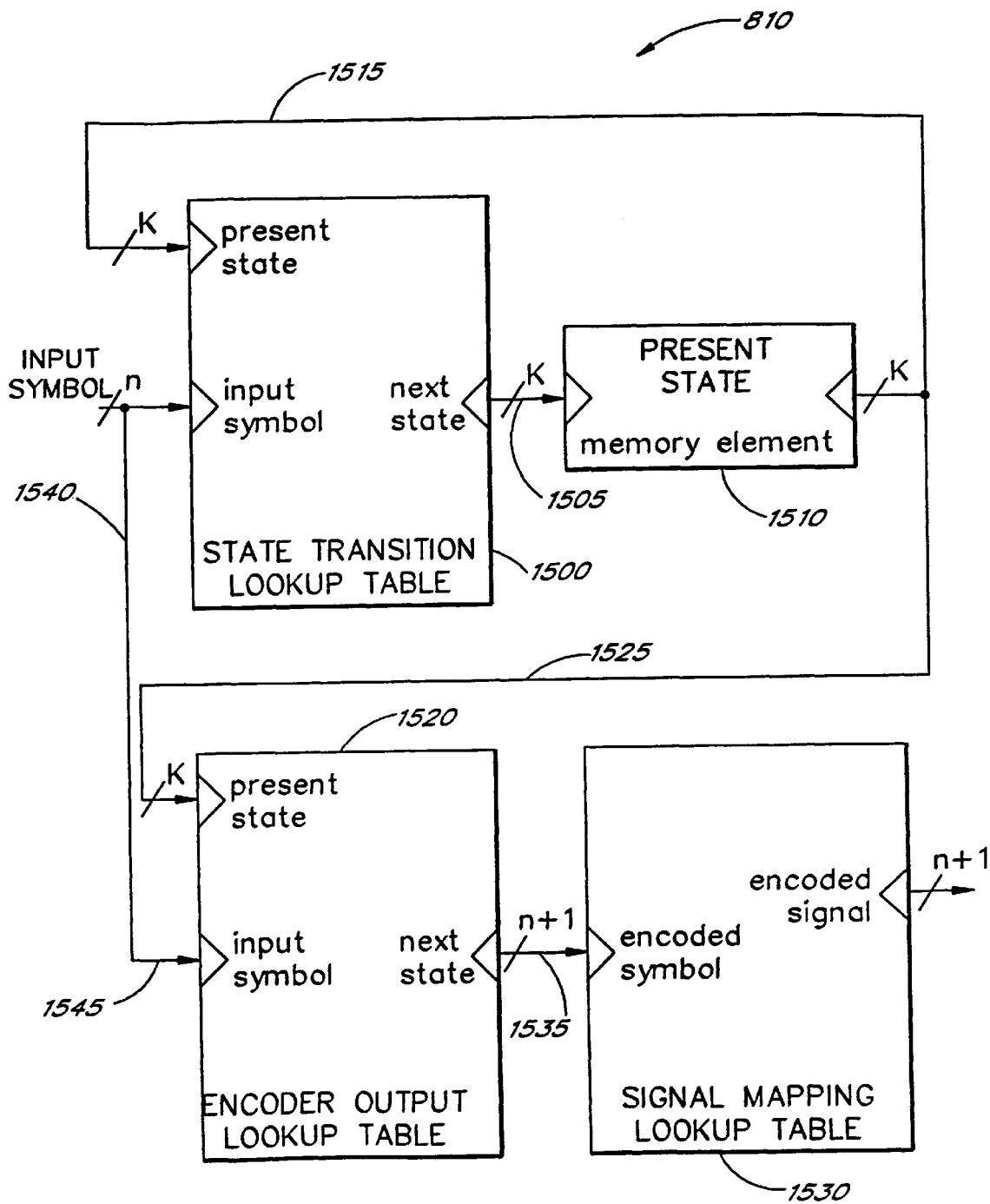
FIG. 21 is a schematic block diagram which shows the main structural and functional elements of a cyclic trellis encoder constructed in accordance with the teachings of the present invention.

FIG. 21 is a schematic block diagram which shows the main structural elements of the general cyclic trellis encoder 810 constructed in accordance with the teachings of the present invention. The encoder 810 includes a state transition look-up table 1500, which may, for example, be fabricated from a ROM IC chip, or realized in software or other input/output state machine circuitry. A next state output of the state transition look-up table 1500 connects to a memory element 1510 via a line 1505. The memory element 1510 may, in one embodiment, be implemented as a series of D-flip flops. The output of the memory element 1510 connects to a present state input of the state transition look-up table 1500 via a line 1515 and to a present state input of an output look-up table 1520 via a line 1525. The output look-up table 1520 connects to a signal mapping look-up table 1530 via a line 1535. The state transition look-up table 1500 and the output look-up table 1520 receive n-bit input symbols via lines 1540, 1545, respectively, while the output of the signal mapping look-up table 1530 serves as the n+1-bit output of the cyclic trellis encoder 810.

In operation, the n-bit input symbol enters the state transition look-up table 1500. In addition, the k-bit present state of the encoder, which is supplied by the memory element 1510, is applied to the present state input of the state transition look-up table 1500. Given the k-bit present state and the n-bit input signal, the state transition table 1500 outputs a next-state value over the line 1505. The state transition look-up table 1500 is implemented so that the next-state value generated by the state transition look-up table 1500 is determined in accordance with the next-state tables of FIGS. 20A–20C.

The next-state value enters the memory element 1510 where the next-state value is stored for one input cycle. That is, upon application of the next n-bit input signal, the next-state value which was applied to the input of the memory element 1510 is passed to the output of the memory element 1510. Thus, the output of the memory element 1510 corresponds to the present state of the trellis encoder 810.

The present state value at the output of the memory element 1510 is applied to the inputs of both the state transition look-up table 1500 and the encoder output look-up table 1520. The output look-up table 1520 receives the present state input via the line 1525 and the input symbol via the line 1545, and generates an encoded n+1-bit output symbol. For applications in AWGN, the output table 1520 is implemented so that the output value generated by the output look-up table 1520 is determined in accordance with the output table of FIG. 19. For applications in Rayleigh fading, the output table will be determined by the particular signal constellation and the well known method of Gray coding.

The output value is then applied to the signal mapping look-up table 1530 via the line 1535. The signal mapping look-up table 1530 assigns each of the $2^{n+1}$ possible output values to a point on the $2^{n+1}$ point signal constellation in accordance with natural or Gray coding, depending on the application.

Cyclic Trellis Decoder

As will be appreciated by one of ordinary skill in the art, a decoder (e.g., the decoder 870 of FIG. 8) for decoding data encoded by means of the above described encoder may be easily realized as a Viterbi decoder. Conventional Viterbi decoders decode the received data stream in accordance with the soft decision Viterbi decoding methods described, given the form of the output look-up table 1520, the state transition look-up table 1500, the signal mapping look-up table 1530.

Briefly, the trellis decoder 870 includes a memory circuit which contains information from the state transition table 1500 concerning the trellis branches (i.e., the state transition paths) which merge into and out of each state. The decoder 870 also includes a memory circuit which contains information from the output look-up 1520 table concerning the [input, output] symbol pair associated with each trellis branch. The decoder 870 further includes a circuit for calculating the decoding metrics which are the Euclidean distances between the received signals and the output signals associated with the trellis branches, as well as a comparator circuit for selecting the most likely path as calculated from the decoding metrics. Of course, it should be understood that each of these circuits could be implemented in software.

Before decoding, the received signal is converted to a digital phase and amplitude value which is fed into the decoder 870. The decoder 870 then determines the decoding metric associated with each state value as determined by the state transition and output look-up table memory circuits. This process is repeated for many symbols, and the corresponding metrics for each state are accumulated. A comparison is made amongst all of the possible states as described above in the section entitled "Maximum Likelihood Viterbi Decoding." Finally the most likely path or sequence of symbols is output by the decoder 870.

Catastrophic Codes

It will be appreciated by those skilled in the art that certain look-up table encoder implementations may result in catastrophic codes. In catastrophic codes, a finite sequence of errors in the received signal sequence may result in an indefinite sequence of decoding errors. One sign that a code could result in a catastrophic encoder implementation is that in a next-state table, a present state transitions into the same next state with a given output, while another present state transitions into the same next state (i.e., stays in the same state) with the same given output. Take, for example, the state transition table of FIG. 13. When the encoder is in the state 0 and a zero input is applied to the encoder, the encoder transitions back to the state 0 with an output of zero. Similarly, when the encoder is in the present state 10 and a zero input is applied to the encoder, the encoder transitions back to the state 10 with an output of zero. Thus, it is possible that such a look-up table implementation of the encoder would cause the encoder to be catastrophic.

In order to avoid catastrophic codes, a simple modification may be made to the state transition look-up table. For example, the table of FIG. 13 could be modified as depicted in the table of FIG. 22. As shown in FIG. 22, the next-state values for present state rows 10 and 14 have been switched so that, upon application of a zero input, the present state 10 transitions into the next state 9. In this manner catastrophic codes may be avoided with little or no significant degradation of error performance.

While various embodiments of the system and method of the present invention have been described, it should be understood that these embodiments have been presented by way of example only, and are not intended to limit the scope of the present invention. Thus, the breadth and scope of the present invention should be defined only in accordance with the following claims and their equivalents.

I claim:

1. A method of cyclic trellis encoding a data sequence within an encoder, wherein said data sequence is to be mapped according to a predetermined modulation scheme having an associated signal constellation, said signal constellation having defined coordinate points corresponding to phase and amplitude characteristics corresponding to output symbols from said encoder, said method comprising the steps of:

defining an output table of output symbols, said output table having present state rows and input symbol columns, wherein said output symbols are determined as a function of symbols input to said encoder and a present state of said encoder, defining said output table further comprising the steps of:

assigning each of said output symbols to said points of said signal constellation;

partitioning said points of said signal constellation into a first subset of output symbols and a second subset of output symbols;

loading even ones of said present state rows with output symbols from said first subset; and loading odd ones of said present state rows with output symbols from said second subset;

defining a next-state table of next states for said encoder, said next-state table having present state rows and input symbol columns, wherein the next states are defined as a function of symbols input to said encoder and a present state of said encoder, defining said next-state look-up table further comprising the steps of:

loading first ones of said present state rows with next states of said encoder until at least one of said first present state rows is full and all of said next state values have been used; and loading other ones of said present state rows with next states that are cyclicly shifted from said next states in each of said first ones of said present state rows until all of said present state rows are filled;

implementing said output and next-state tables within said encoder so that output symbols from said encoder are determined by input symbols to said encoder and the present state of said encoder in accordance with said output table, and transitions from the present state of said encoder to the next state of said encoder are performed in accordance with said next-state table; and mapping said output symbols into signals having phase and amplitude characteristics corresponding to points on said signal constellation.

2. A method as defined in claim 1, wherein said coordinate points of said signal constellation are assigned output symbols according to natural mapping techniques when the predominant channel interference is Additive White Gaussian Noise.

3. A method as defined in claim 1, wherein said coordinate points of said signal constellation are assigned to output symbols according to Gray coding techniques when the predominant channel interference is Rayleigh fading.

4. A method of cyclic trellis encoding an input data sequence with an encoder, wherein said input data sequence is to be mapped according to a predetermined modulation scheme having an associated signal constellation, said signal constellation having defined coordinate points corresponding to phase and amplitude characteristics of output symbols from said encoder, said encoder receiving n inputs, corresponding to $2^n$ possible input values, and outputting n+1 outputs corresponding to $2^{n+1}$ possible output values, said encoder further having $2^k$ possible states, said method comprising the steps of:

defining an output table having $2^k$ present state rows and $2^n$ input symbol columns, wherein output symbols from said encoder are determined as a function of input symbols to said encoder and a present state of said encoder, defining said output table further comprising the steps of:

assigning values to said points of said signal constellation, said values corresponding to said output symbols;

partitioning said signal constellation into a first subset of $2^n$ output symbols and a second subset of $2^n$ output symbols;

loading even ones of said present state rows with values corresponding to output symbols from said first subset; and loading odd ones of said present state rows with values corresponding to output symbols from said second subset;

defining a next-state table of a plurality of next states, said next-state table having $2^k$ present state rows and $2^n$ input symbol columns, wherein the next state of said encoder is determined as a function of the input symbols to said encoder and the present state of said encoder, defining said next-state table further comprising the steps of:

dividing said next states into $2^{k-n}$ subsets wherein each subset has $2^n$ next states; and loading a first one of said present state rows with next states from a first one of said subsets, a second one of said present state rows with the next states from a second one of said subsets, and continuing this loading until the $2^{k-n}$th present state row is loaded with the next states from the $2^{k-n}$th one of said subsets;

implementing said output and next-state tables within said encoder so that output symbols from said encoder are determined as a function of input symbols to said encoder and the present state of said encoder in accordance with said output table, and transitions from the present state of said encoder to the next state of said encoder are in accordance with said next-state table; and mapping said output symbols from said encoder into signals having phase and amplitude characteristics corresponding to respective output symbol points on said signal constellation.

5. A method as defined in claim 4, wherein said coordinate points of said signal constellation are assigned output symbols according to natural mapping techniques when the predominant channel interference is Additive White Gaussian Noise.

6. A method as defined in claim 4, wherein said coordinate points of said signal constellation are assigned output symbols according to Gray coding techniques when the predominant channel interference is Rayleigh fading.

7. A transmitter for a trellis-coded, multi-level modulation communication system comprising:

a cyclic trellis encoder which receives a sequence of data input symbols and outputs a sequence of encoded output symbols, said cyclic trellis encoder having a set of present states partitioned into subsets, said encoder comprising:

a state transition table containing a plurality of next state values for said encoder, wherein the next state values are defined based upon the present state of said encoder and the input symbol, wherein said next state values are assigned to each of said present state subsets such that the next state values for any present state subset are shifted cyclicly for successive members of said any present state subset;

a present state memory element which connects to said state transition look-up table and which temporarily stores a next state value output by said state transition look-up table; and an encoder output look-up table connected to said present state memory element which selects an output symbol based upon said present state of said encoder and said presently received one of said input symbols, and wherein said present states are partitioned into two subsets and the outputs are partitioned into two subsets so that said output look-up table outputs a symbol which belongs to a first output subset when in one of said present state subsets and outputs a symbol which belongs to a second output subset when in the other of said present state subsets;

a signal mapper which connects to said output look-up table, and which maps outputs of said encoder output look-up table into encoded output signals from two symmetric signal constellations; and a transmitter circuit for transmitting said encoded output signals over a communications medium.

8. The transmitter of claim 7, wherein said signal mapper maps according to Gray coding techniques.

9. The transmitter of claim 7, wherein said signal mapper maps according to natural mapping techniques.

* * * * *